United States Patent
Saida et al.

(10) Patent No.: US 8,716,817 B2
(45) Date of Patent: May 6, 2014

(54) MAGNETIC MEMORY ELEMENT AND NONVOLATILE MEMORY DEVICE

(75) Inventors: Daisuke Saida, Tokyo (JP); Minoru Amano, Kanagawa-ken (JP); Yuichi Ohsawa, Kanagawa-ken (JP); Junichi Ito, Kanagawa-ken (JP); Hiroaki Yoda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 13/416,724

(22) Filed: Mar. 9, 2012

(65) Prior Publication Data

US 2013/0069185 A1   Mar. 21, 2013

(30) Foreign Application Priority Data

Sep. 21, 2011   (JP) .................................. 2011-206662

(51) Int. Cl.
*H01L 29/82*   (2006.01)
(52) U.S. Cl.
USPC ........... 257/421; 257/422; 257/423; 257/426; 257/427; 438/3; 365/157; 365/158; 360/324.3; 360/326

(58) Field of Classification Search
USPC .............. 257/421–427; 438/3; 360/324–326, 360/313; 365/157–158, 171–173
See application file for complete search history.

(56) References Cited

U.S. PATENT DOCUMENTS

| 8,014,193 | B2 | 9/2011 | Nakayama et al. |
| 8,077,509 | B2 | 12/2011 | Yanagi et al. |
| 8,085,582 | B2 | 12/2011 | Nakamura et al. |
| 2006/0171199 | A1* | 8/2006 | Ju .................................. 365/171 |
| 2009/0015958 | A1* | 1/2009 | Nakamura et al. ............... 360/55 |
| 2012/0068281 | A1* | 3/2012 | Saida et al. .................... 257/421 |

FOREIGN PATENT DOCUMENTS

JP   2009-21352   1/2009

OTHER PUBLICATIONS

U.S. Appl. No. 13/601,343, filed Aug. 31, 2012, Saida, et al.
U.S. Appl. No. 13/228,040, filed Sep. 8, 2011, Daisuke Saida, et al.
U.S. Appl. No. 13/227,959, filed Sep. 8, 2011, Daisuke Saida, et al.
U.S. Appl. No. 13/210,678, filed Aug. 16, 2011, Tadaomi Daibou, et al.
U.S. Appl. No. 13/037,592, filed Mar. 1, 2011, Daisuke Saida, et al.
U.S. Appl. No. 13/795,620, filed Mar. 12, 2013, Saida, et al.

* cited by examiner

*Primary Examiner* — Jami M Valentine
(74) *Attorney, Agent, or Firm* — Oblon, Spivak, McClelland, Maier & Neustadt, L.L.P.

(57) ABSTRACT

According to one embodiment, a magnetic memory element includes a stacked body including first and second stacked units stacked with each other. The first stacked unit includes first and second ferromagnetic layers and a first nonmagnetic layer provided therebetween. The second stacked unit includes third and fourth ferromagnetic layers and a second nonmagnetic layer provided therebetween. Magnetization of the second and third ferromagnetic layers are variable. Magnetizations of the first and fourth ferromagnetic layers are fixed in a direction perpendicular to the layer surfaces. A cross-sectional area of the third ferromagnetic layer is smaller than a cross-sectional area of the first stacked unit when cut along a plane perpendicular to the stacking direction.

20 Claims, 17 Drawing Sheets

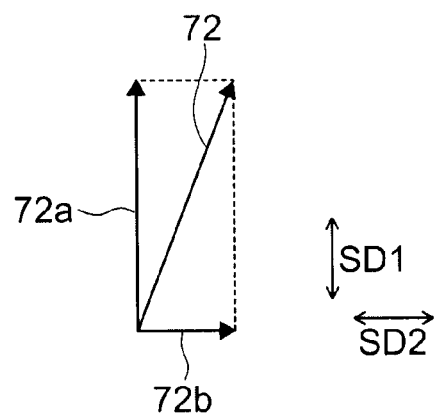
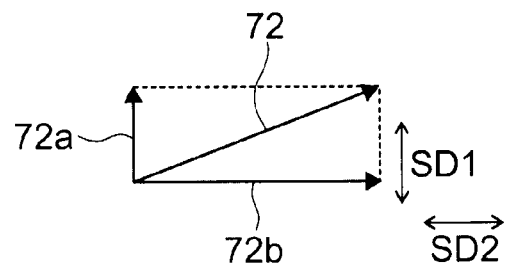
FIG. 2A  FIG. 2B
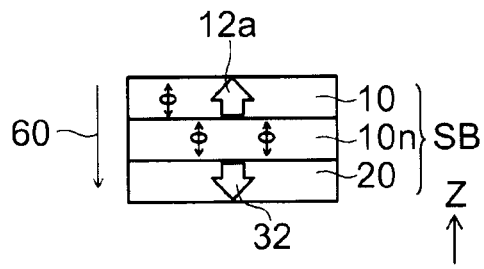
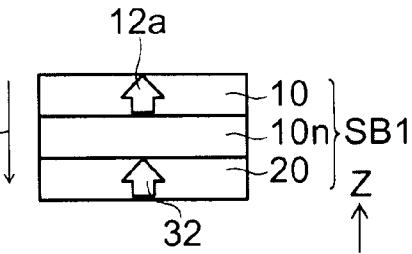
FIG. 3A  FIG. 3B
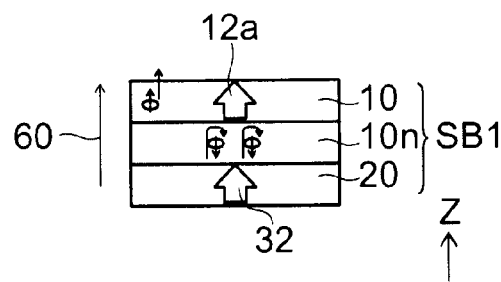
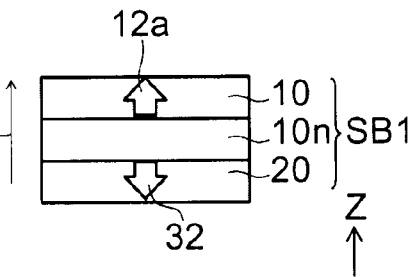
FIG. 3C  FIG. 3D
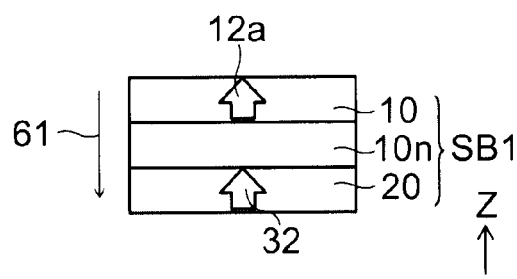
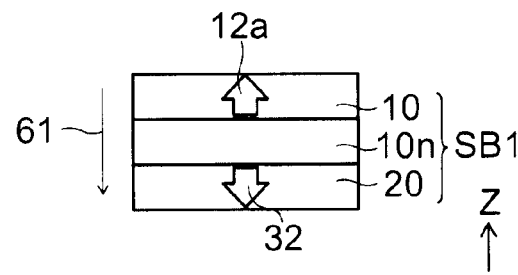
FIG. 4A  FIG. 4B

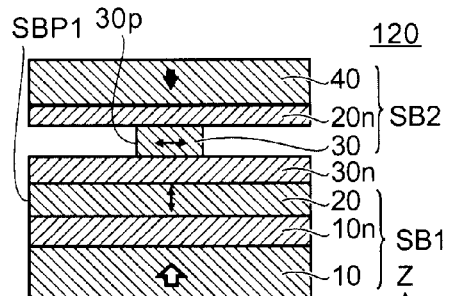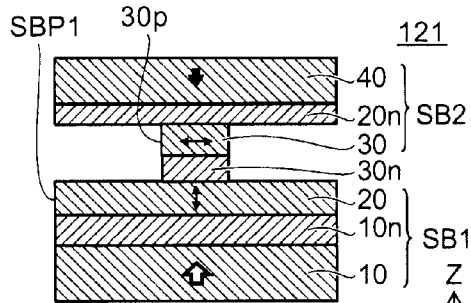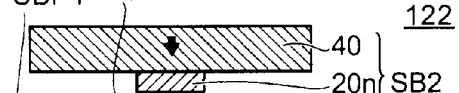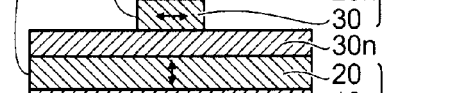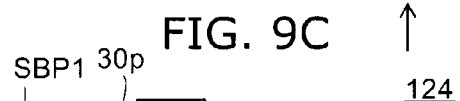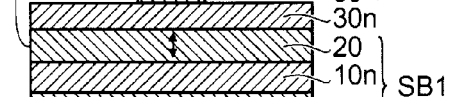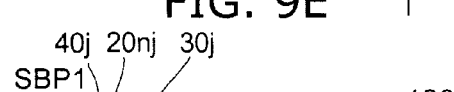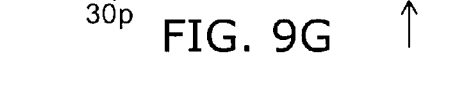

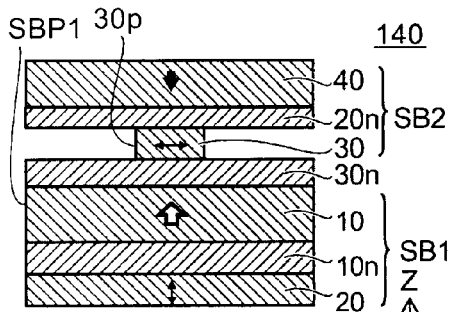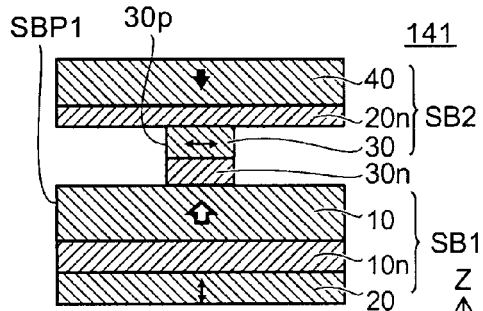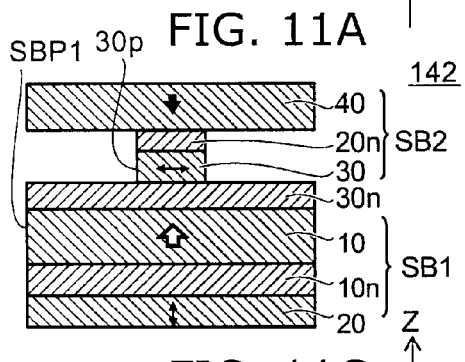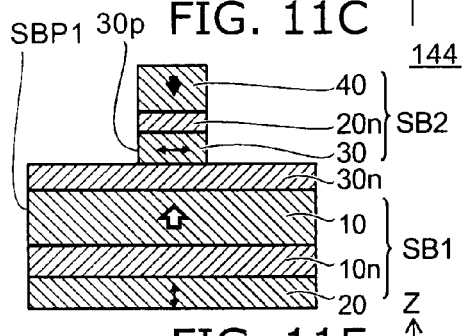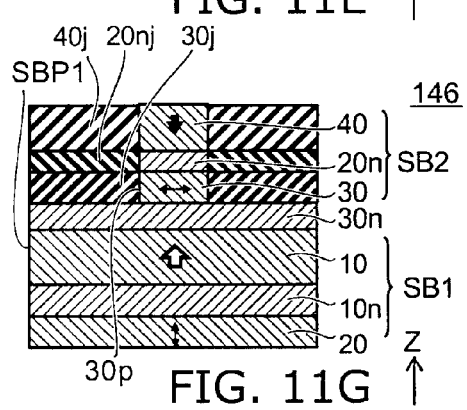

MAGNETIC MEMORY ELEMENT AND NONVOLATILE MEMORY DEVICE

CROSS-REFERENCE TO RELATED APPLICATIONS

This application is based upon and claims the benefit of priority from the prior Japanese Patent Application No. 2011-206662, filed on Sep. 21, 2011; the entire contents of which are incorporated herein by reference.

FIELD

Embodiments described herein relate generally to a magnetic memory element and a nonvolatile memory device.

BACKGROUND

Some magnetic random access memories (MRAM) have a configuration in which a magnetic tunnel junction (MTJ) element exhibiting the tunneling magnetoresistive (TMR) effect is used for a data memory unit. The configuration is drawing attention as a high-speed and large-capacity nonvolatile memory. Writing to the memory layer of the MTJ element is performed by, for example, a spin-transfer torque writing system. In the system, for example, a current is passed directly through the MTJ element and a spin-transfer torque injected from the reference layer of the MTJ element is used to reverse the magnetization of the memory layer. It is desired to enable further downsizing of such a magnetic memory element to achieve a high-density nonvolatile memory device.

BRIEF DESCRIPTION OF THE DRAWINGS

FIG. 2A and FIG. 2B are schematic views showing magnetization;

FIG. 3A to FIG. 3D are schematic views showing the operation of the magnetic memory element according to the embodiment;

FIG. 4A and FIG. 4B are schematic views showing the operation of the magnetic memory element according to the embodiment;

FIG. 9A to FIG. 9H are schematic cross-sectional views showing other magnetic memory elements according to the first embodiment;

FIG. 11A to FIG. 11H are schematic cross-sectional views showing other magnetic memory elements according to the first embodiment;

DETAILED DESCRIPTION

Figure 1A:
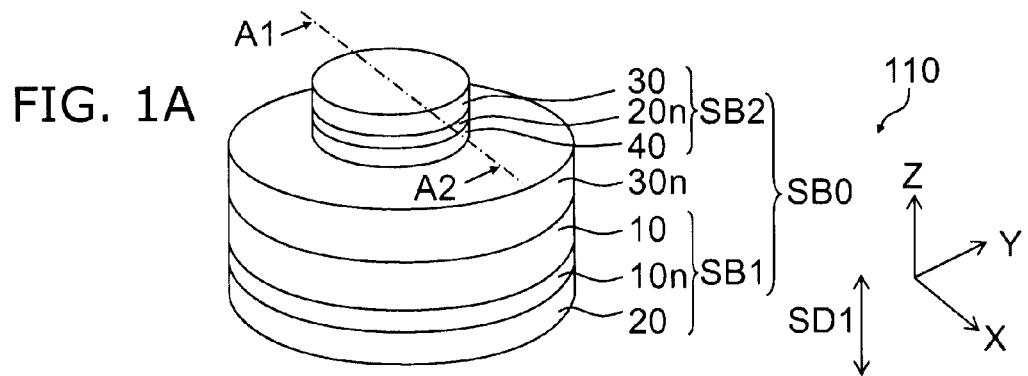
FIG. 1A to FIG. 1C are schematic views showing a magnetic memory element according to a first embodiment.

According to one embodiment, a magnetic memory element includes a stacked body. The stacked body includes a first stacked unit and a second stacked unit. The first stacked unit includes a first ferromagnetic layer, a second ferromagnetic layer and a first nonmagnetic layer. A magnetization of the first ferromagnetic layer is fixed in a first direction having a component perpendicular to a film surface of the first ferromagnetic layer. The second ferromagnetic layer is stacked with the first ferromagnetic layer along a stacking direction. A direction of a magnetization of the second ferromagnetic layer is variable in directions perpendicular to a film surface of the second ferromagnetic layer. The first ferromagnetic layer, the second ferromagnetic layer, and the first nonmagnetic layer are stacked along a stacking direction. The first nonmagnetic layer is provided between the first ferromagnetic layer and the second ferromagnetic layer. The second stacked unit is stacked with the first stacked unit along the stacking direction. The second stacked unit includes a third ferromagnetic layer, a fourth ferromagnetic layer and a second nonmagnetic layer. A direction of a magnetization of the third ferromagnetic layer is variable in directions parallel to a film surface of the third ferromagnetic layer. The fourth ferromagnetic layer is stacked with the third ferromagnetic layer along the stacking direction. A magnetization of the fourth ferromagnetic layer is fixed in a second direction having a component perpendicular to a film surface of the fourth ferromagnetic layer. The second nonmagnetic layer is provided between the third ferromagnetic layer and the fourth ferromagnetic layer. A cross-sectional area of the third ferromagnetic layer is smaller than a cross-sectional area of the first stacked unit when cut along a plane perpendicular to the stacking direction. A direction of the magnetization of the second ferromagnetic layer is set to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer.

According to another embodiment, a nonvolatile memory device includes a magnetic memory element. The magnetic memory element includes a stacked body, a first interconnection and a second interconnection. The stacked body includes a first stacked unit and a second stacked unit. The first stacked unit includes a first ferromagnetic layer, a second ferromagnetic layer and a first nonmagnetic layer. A magnetization of the first ferromagnetic layer is fixed in a first direction having a component perpendicular to a film surface of the first ferromagnetic layer. The second ferromagnetic layer is stacked with the first ferromagnetic layer along a stacking direction. A direction of a magnetization of the second ferromagnetic layer is variable in directions perpendicular to a film surface of the second ferromagnetic layer. The first nonmagnetic layer is provided between the first ferromagnetic layer and the second ferromagnetic layer. The second stacked unit is stacked with the first stacked unit along the stacking direction. The second stacked unit includes a third ferromagnetic layer, a fourth ferromagnetic layer and a second nonmagnetic layer. A direction of a magnetization of the third ferromagnetic layer is variable in directions parallel to a film surface of the third ferromagnetic layer. The fourth ferromagnetic layer is stacked with the third ferromagnetic layer along the stacking direction. A magnetization of the fourth ferromagnetic layer is fixed in a second direction having a component perpendicular to a film surface of the fourth ferromagnetic layer. The second nonmagnetic layer is provided between the third ferromagnetic layer and the fourth ferromagnetic layer. A cross-sectional area of the third ferromagnetic layer is smaller than a cross-sectional area of the first stacked unit when cut along a plane perpendicular to the stacking direction. A direction of the magnetization of the second ferromagnetic layer is set to a direction in accordance with a direction of a current by causing an electron whose spin is polarized by passing the current through the stacked body along to the stacking direction to act on the second ferromagnetic layer and by causing a rotating magnetic field generated from a precession of the magnetization of the third ferromagnetic layer to act on the second ferromagnetic layer. The first interconnection is directly or indirectly connected to one end of the magnetic memory element. The second interconnection is directly or indirectly connected to another end of the magnetic memory element. The first and second interconnections are configured to flow the current though the stacked body along the stacking direction.

Various embodiments will be described hereinafter with reference to the accompanying drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

Figure 1B:
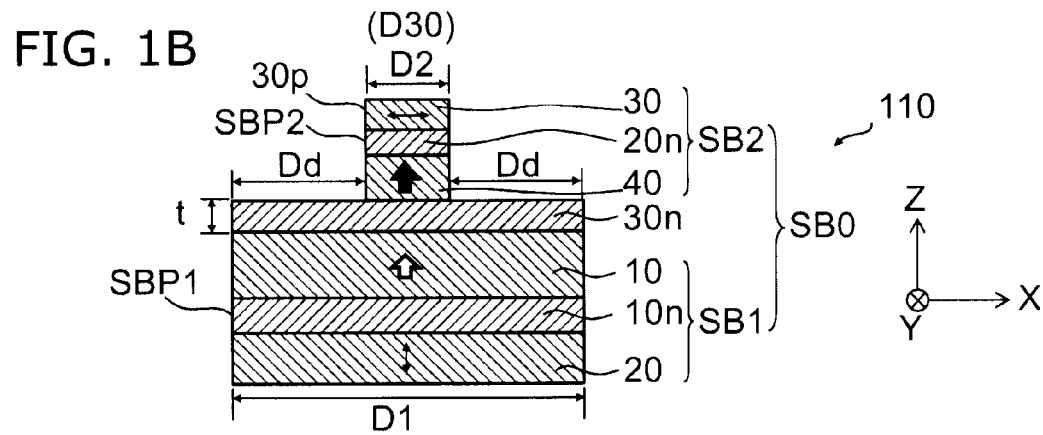
Figure 1C:
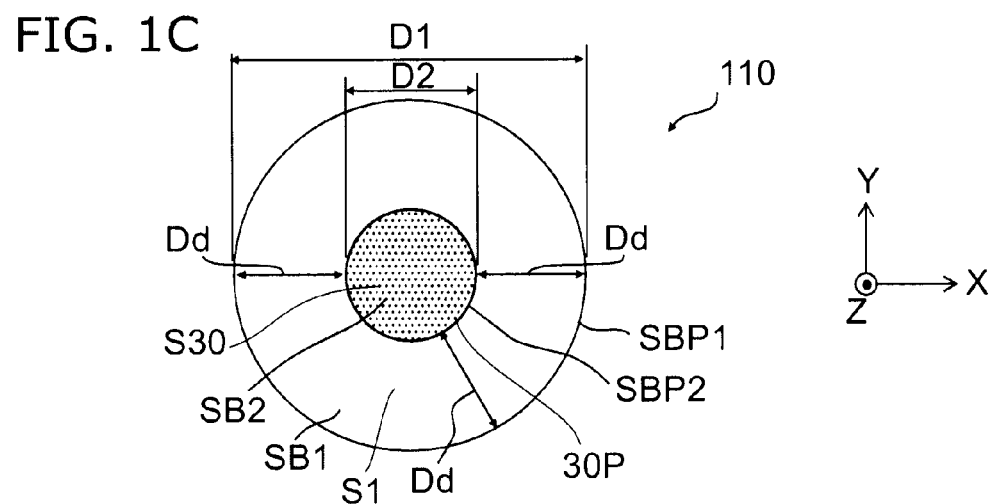

FIG. 1A to FIG. 1C are schematic views illustrating the configuration of a magnetic memory element according to a first embodiment.

FIG. 1A is a schematic perspective view. FIG. 1B is a cross-sectional view taken along line A1-A2 of FIG. 1A. FIG. 1C is a schematic plan view.

As shown in FIG. 1A to FIG. 1C, a magnetic memory element 110 according to the embodiment includes a stacked body SB0. The stacked body SB0 includes a first stacked unit SB1 and a second stacked unit SB2.

The first stacked unit SB1 includes a first ferromagnetic layer 10, a second ferromagnetic layer 20, and a first nonmagnetic layer 10n.

In the first ferromagnetic layer 10, the magnetization (the magnetization of the first ferromagnetic layer 10) is fixed in a first direction having a component perpendicular to the film surface. In the second ferromagnetic layer 20, the direction of the magnetization (the magnetization of the second ferromagnetic layer 20) is variable in directions perpendicular to the film surface. The first nonmagnetic layer 10n is provided between the first ferromagnetic layer 10 and the second ferromagnetic layer 20. The "film surface" is a surface parallel to the major surface of the layer and corresponds to a "layer surface."

That is, the first ferromagnetic layer 10, the second ferromagnetic layer 20, and the first nonmagnetic layer 10n are stacked. The direction along which the first ferromagnetic layer 10, the second ferromagnetic layer 20, and the first nonmagnetic layer 10n are stacked is referred to as a stacking direction SD1. The stacking direction SD1 is, for example, a direction perpendicular to the film surface of the first ferromagnetic layer 10.

For convenience of description, an axis parallel to the stacking direction SD1 is taken as a Z-axis. One axis perpendicular to the Z-axis is taken as an X-axis. The axis perpendicular to the Z-axis and the X-axis is taken as a Y-axis.

In the specification of this application, "stack" includes not only the case where a plurality of layers are stacked in contact with each other but also the case where a plurality of layers are stacked via other components.

The second stacked unit SB2 is stacked with the first stacked unit SB1 along the stacking direction SD1. The second stacked unit SB2 includes a third ferromagnetic layer 30, a fourth ferromagnetic layer 40, and a second nonmagnetic layer 20n. In the third ferromagnetic layer 30, the direction of the magnetization (the magnetization of the third ferromagnetic layer 30) is variable in directions parallel to the film surface. The fourth ferromagnetic layer 40 is stacked with the third ferromagnetic layer 30 along the stacking direction SD1. In the fourth ferromagnetic layer 40, the magnetization (the magnetization of the fourth ferromagnetic layer 40) is fixed in a second direction having a component perpendicular to the film surface. The second nonmagnetic layer 20n is provided between the third ferromagnetic layer 30 and the fourth ferromagnetic layer 40.

That is, the third ferromagnetic layer 30, the fourth ferromagnetic layer 40, and the second nonmagnetic layer 20n are stacked with the first ferromagnetic layer 10, the second ferromagnetic layer 20, and the first nonmagnetic layer 10n along the stacking direction SD1. As described later, the order of the layers may be variously altered.

As shown in FIG. 1C, the cross-sectional area S30 of the third ferromagnetic layer 30 when cut along a plane perpendicular to the stacking direction SD1 is smaller than the cross-sectional area S1 of the first stacked unit SB1 when cut along a plane perpendicular to the stacking direction SD1.

For example, the outer edge (a first outer edge SBP1) of the first stacked unit SB1 in a plane normal to the stacking direction SD1 includes a portion outside the outer edge 30p of the third ferromagnetic layer 30 in the plane. In this example, the third ferromagnetic layer 30, the second nonmagnetic layer 20n, and the fourth ferromagnetic layer 40 have the same width (the length along an axis perpendicular to the Z-axis). Therefore, the position of the outer edge 30p of the third ferromagnetic layer 30 in the plane normal to the stacking direction SD1 is the same as the position of the outer edge (a second outer edge SBP2) of the second stacked unit SB2 in the plane normal to the stacking direction SD1.

In this example, the first ferromagnetic layer 10, the first nonmagnetic layer 10n, and the second ferromagnetic layer 20 have the same width (the length along an axis perpendicular to the Z-axis). Therefore, the position of the outer edge of the first ferromagnetic layer 10, the position of the outer edge of the first nonmagnetic layer 10n, and the position of the outer edge of the second ferromagnetic layer 20 in the plane normal to the stacking direction SD1 are the same as the position of the first outer edge SBP1 of the first stacked unit SB1 in the plane normal to the stacking direction SD1.

As described later, for example, the width (the length along an axis perpendicular to the Z-axis) of the third ferromagnetic layer 30 may be different from the width (the length along an axis perpendicular to the Z-axis) of the fourth ferromagnetic layer 40 in the second stacked unit SB2. Also in this case, in the embodiment, the cross-sectional area S30 of the third ferromagnetic layer 30 is smaller than the cross-sectional area S1 of the first stacked unit SB1. For example, the first outer edge SBP1 of the first stacked unit SB1 includes a portion outside the outer edge 30p of the third ferromagnetic layer 30.

Hereinbelow, for the sake of simple description, the case is described where the third ferromagnetic layer 30, the second nonmagnetic layer 20n, and the fourth ferromagnetic layer 40 have the same width, and the first ferromagnetic layer 10, the first nonmagnetic layer 10n, and the second ferromagnetic layer 20 have the same width. Further, the second outer edge SBP2 of the second stacked unit SB2 is described as the outer edge 30p of the third ferromagnetic layer 30.

In this example, the cross-sectional area of the second stacked unit SB2 when cut along a plane perpendicular to the stacking direction SD1 is smaller than the cross-sectional area S1 of the first stacked unit SB1 when cut along a plane perpendicular to the stacking direction SD1. For example, when projected onto a plane perpendicular to the stacking direction SD1, the first outer edge SBP1 of the first stacked unit SB1 includes a portion outside the second outer edge SBP2 of the second stacked unit SB2. In other words, in a planar view, the second outer edge SBP1 includes a portion outside the first outer edge SBP2.

In this example, the first outer edge SBP1 (the outer edge of the first stacked unit SB1 when projected onto a plane perpendicular to the stacking direction SD1) is located on the outside of the second outer edge SBP2 (the outer edge of the second stacked unit SB2 when projected onto a plane perpendicular to the stacking direction SD1). Specifically, the entire first outer edge SBP1 is located on the outside of the second outer edge SBP2.

For example, the width D30 of the third ferromagnetic layer 30 along the X-axis is smaller than the width (e.g. a first diameter D1) of the first stacked unit SB1 along the X-axis. The width of the third ferromagnetic layer 30 along the Y-axis is smaller than the width of the first stacked unit SB1 along the Y-axis.

For example, when the third ferromagnetic layer 30 has the same size as the fourth ferromagnetic layer 40 and the second nonmagnetic layer 20n, the width (e.g. a second diameter D2) of the second stacked unit SB2 along the X-axis is smaller than the width (the first diameter D1) of the first stacked unit SB1 along the X-axis. Similarly, the width of the second stacked unit SB2 along the Y-axis is smaller than the width of the first stacked unit SB1 along the Y-axis.

For example, the distance between the second outer edge SBP2 of the second stacked unit SB2 and the first outer edge SBP1 of the first stacked unit SB1 is a distance Dd. The distance Dd is, for example, a distance along an arbitrary axis in the X-Y plane. For example, the total of twice the distance Dd and the width D30 of the third ferromagnetic layer 30 is the first diameter D1.

For example, the cross-sectional area of the third ferromagnetic layer 30 when cut along the X-Y plane (e.g. the cross-sectional area of the second stacked unit SB2 when cut along the X-Y plane) is smaller than the cross-sectional area of the first stacked unit SB1 when cut along the X-Y plane.

In the magnetic memory element 110, an electron whose spin is polarized by passing a current through the stacked body SB0 along the stacking direction SD1 is caused to act on the second ferromagnetic layer 20, and a rotating magnetic field generated from the precession of the magnetization of the third ferromagnetic layer 30 is caused to act on the second ferromagnetic layer 20. Thereby, the direction of the magnetization of the second ferromagnetic layer 20 can be determined to a direction in accordance with the direction of the current. The current mentioned above flows in a direction substantially perpendicular to the film surfaces of the layers of the stacked body SB0.

In the magnetic memory element 110, the second stacked unit SB2 functions as a magnetic field generation unit. The first stacked unit SB1 functions as a magnetic memory unit. Hereinafter, the second stacked unit SB2 may be referred to as the magnetic field generation unit and the first stacked unit SB1 may be referred to as the magnetic memory unit, as appropriate.

The first ferromagnetic layer 10 is, for example, a first magnetization fixed layer. In the second ferromagnetic layer 20, the magnetization easy axis is in a direction substantially perpendicular to the film surface. The second ferromagnetic layer 20 functions as a magnetic memory layer. The first nonmagnetic layer 10n functions as a first spacer layer. The first stacked unit SB1 including the first ferromagnetic layer 10, the first nonmagnetic layer 10n, and the second ferromagnetic layer 20 has a structure of, for example, MTJ (magnetic tunnel junction).

The third ferromagnetic layer 30 functions as a magnetization rotation layer (oscillation layer). The fourth ferromagnetic layer 40 functions as a second magnetization fixed layer in which the magnetization is fixed in a direction substantially perpendicular to the film surface. The second nonmagnetic layer 20n functions as a second spacer layer.

The magnetic memory element 110 having such a configuration can perform prescribed operation even when downsized. Thereby, the nonvolatile memory device can achieve high density.

In the magnetic memory unit (the first stacked unit SB1), for example, a design in which Ku·V is set to a constant value is employed in order to ensure prescribed operation. Here, Ku is the magnetic anisotropy energy of the second ferromagnetic layer 20 (the memory layer), and V is the volume of the second ferromagnetic layer 20. When the nonvolatile memory device is densified and the magnetic memory element is downsized (V is decreased), a large Ku is used.

The inventors have found that the resonance frequency $f_r$ in the second ferromagnetic layer 20 is expressed by Formula 1 below.

[Mathematical formula 1]

$$f_r = \frac{\gamma}{2\pi}(H_{keff}) = \frac{\gamma}{2\pi}\left(\frac{2K_u}{M_s} - 4\pi M_s N_z\right) \quad (1)$$

where γ is the gyromagnetic ratio (approximately 17.6×10⁶ Hz/Oe; hertz/oersted), Ku (erg/cm³; erg/cubic centimeter) is the magnetic anisotropy of the second ferromagnetic layer 20, Ms (emu/cc=emu/cm³) is the saturation magnetization of the second ferromagnetic layer 20, and Nz is the demagnetizing factor of the second ferromagnetic layer 20. Nz is a dimensionless constant.

Formula 1 shows that the resonance frequency $f_r$ increases with increasing Ku. In the embodiment, the rotation (oscillation) frequency $f_s$ of the rotation high frequency magnetic field generated from the precession of the magnetization of the third ferromagnetic layer 30 in the magnetic field generation unit (the second stacked unit SB2) is made to substantially coincide with the resonance frequency $f_r$ in the magnetic memory unit. Therefore, it has been found that downsizing requires increasing the oscillation frequency $f_s$ of the high frequency magnetic field generated from the magnetic field generation unit.

The magnetic memory element according to the embodiment can solve such a newly found issue.

That is, the oscillation frequency $f_s$ of the high frequency magnetic field generated from the magnetic field generation unit is expressed by Formula 2 below.

[Mathematical formula 2]

$$f_s = \frac{\gamma}{2\pi}\left|\frac{\alpha_J}{\alpha}\vec{p}\right| = \frac{\gamma}{2\pi\alpha}\left(\frac{\hbar}{2e}\right)\left(\frac{g(\theta)}{M_s t}\right)J \quad (2)$$

$$\hbar = h/2\pi$$

where γ is the gyromagnetic ratio. α is the damping constant and a dimensionless constant. h is the Planck constant and approximately 6.626×10⁻²⁷ erg·s (erg/second). 6.626×10⁻²⁷ ergs (erg/second) is equivalent to 6.626×10⁻³⁴ J·s (joule/second). e represents the elementary electric charge and approximately 1.60218×10⁻¹⁹ (A·s; ampere·second). Ms (emu/cc) is the saturation magnetization of the third ferromagnetic layer 30. t (cm; centimeter) is the thickness of the third ferromagnetic layer 30. J (A/cm²; ampere/square centimeter) represents the current density in the third ferromagnetic layer 30. g(θ) is a parameter representing the efficiency of spin transfer depending on the spin polarization factor. Here, θ (rad; radian) is the angle between the direction of the spin of the electron that is spin-polarized by passing through the fourth ferromagnetic layer 40 and the magnetization of the third ferromagnetic layer 30. As a system of units, the conversion from "°; degree" to "rad; radian" is "rad=(2π/360)×degree".

Formula 2 shows that the oscillation frequency $f_s$ can increase by, for example, decreasing the Ms of the material used. However, this method imposes limitations on the material used, and interferes with increasing the overall characteristics.

In the embodiment, a method of increasing the current density J is employed. Thereby, the limitations on the material are removed. To increase the current density J, the size (the width D3; the length along an axis perpendicular to the Z-axis direction) of the third ferromagnetic layer 30 is decreased.

In other words, the size of the third ferromagnetic layer 30 decreases by a configuration in which the outer edge (the first outer edge SBP1) of the first stacked unit SB1 in a plane normal to the stacking direction SD1 includes a portion outside the outer edge 30p of the third ferromagnetic layer 30 in the plane. That is, the cross-sectional area S30 of the third ferromagnetic layer 30 is smaller than the cross-sectional area S1 of the first stacked unit SB1. Thereby, the current density 3 in the third ferromagnetic layer 30 can increase, and the oscillation frequency $f_s$ can increase. Thereby, when downsized, the nonvolatile memory device can perform prescribed operation and achieve high density.

Examples of the characteristics of the magnetic memory element 110 are described later.

As illustrated in FIG. 1C, in this example, the shapes of the first stacked unit SB1 and the second stacked unit SB2 when cut along a plane perpendicular to the Z-axis are a circle (including a flat circle). In the embodiment, however, the shapes of the first stacked unit SB1 and the second stacked unit SB2 when cut along a plane perpendicular to the Z-axis are arbitrary.

In the magnetic memory element 110, the stacked body SB0 further includes a third nonmagnetic layer 30n. The third nonmagnetic layer 30n is provided between the first stacked unit SB1 and the second stacked unit SB2. That is, the third nonmagnetic layer 30n is provided between the second ferromagnetic layer 20 and the third ferromagnetic layer 30. The third nonmagnetic layer 30n is provided as necessary and may be omitted.

A perpendicular magnetization film, for example, is used as the first ferromagnetic layer 10, the second ferromagnetic layer 20, and the fourth ferromagnetic layer 40. An in-plane magnetization film, for example, is used as the third ferromagnetic layer 30.

FIG. 2A and FIG. 2B are schematic views illustrating magnetization.

FIG. 2A illustrates the magnetization in a perpendicular magnetization film. FIG. 2B illustrates the magnetization in an in-plane magnetization film.

As shown in FIG. 2A and FIG. 2B, one axis perpendicular to the stacking direction SD1 is taken as an in-plane axis SD2. The in-plane axis SD2 is an axis in the X-Y plane. An out-of-plane magnetization component 72a is defined as to be a projection of the magnetization 72 onto the Z-axis. The out-of-plane magnetization component 72a is parallel to the stacking direction SD1. An in-plane magnetization component 72b is defined as to be a projection of the magnetization 72 onto the X-Y plane. The in-plane magnetization component 72b is parallel to the in-plane axis SD2.

As shown in FIG. 2A, the perpendicular magnetization film has a magnetization state in which the out-of-plane magnetization component 72a is larger than the in-plane magnetization component 72b. In the perpendicular magnetization film, the direction of the magnetization is preferably substantially perpendicular to the film surface in view of operating characteristics.

As shown in FIG. 2B, the in-plane magnetization film has a magnetization state in which the in-plane magnetization component 72b is larger than the out-of-plane magnetization component 72a. In the in-plane magnetization film, the direction of the magnetization is preferably substantially parallel to the film surface in view of operating characteristics.

For convenience of description, the direction from the first stacked unit SB1 toward the second stacked unit SB2 is referred to as "upward" or an "upward direction." The direction from the second stacked unit SB2 toward the first stacked unit SB1 is referred to as "downward" or a "downward direction."

As described above, the magnetization of the first ferromagnetic layer 10 is substantially fixed in the first direction. The magnetization of the fourth ferromagnetic layer 40 is substantially fixed in the second direction.

As illustrated in FIG. 1B, in the magnetic memory element 110, the first direction is the upward direction, and also the second direction is the upward direction. However, as described later, the first direction and the second direction may be variously altered.

In the magnetic memory element 110, for example, an electronic current can be passed through the stacked body SB0 with a pair of electrodes (not shown) provided across the stacked body SB0. The electronic current is a flow of electrons. When a current flows upward, the electronic current flows downward.

The second ferromagnetic layer 20 takes the role of storing data. The magnetization of the second ferromagnetic layer 20 can be reversed comparatively easily. The third ferromagnetic layer 30 takes the role of generating a high frequency magnetic field in writing.

When an electronic current is passed in the direction perpendicular to the film surface, the magnetization in the third ferromagnetic layer 30 of the magnetic field generation unit precesses. Thereby, a rotating magnetic field (a high frequency magnetic field) is generated. The frequency of the high frequency magnetic field is, for example, about 1 GHz to 60 GHz. The high frequency magnetic field has a component in a direction perpendicular to the magnetization of the second ferromagnetic layer 20 (a component in the direction of the magnetization hard axis of the second ferromagnetic layer 20). Therefore, at least part of the high frequency magnetic field generated from the third ferromagnetic layer 30 is applied in the direction of the magnetization hard axis of the second ferromagnetic layer 20. If the high frequency magnetic field generated from the third ferromagnetic layer 30 is applied in the direction of the magnetization hard axis of the second ferromagnetic layer 20, it becomes very easy for the magnetization of the second ferromagnetic layer 20 to reverse.

In the magnetic memory element 110, the direction of the magnetization of the second ferromagnetic layer 20 can be controlled by passing an electronic current through the stacked body SB0. Specifically, the direction of the magnetization of the second ferromagnetic layer 20 can be reversed by changing the direction of the flow of the electronic current (polarity). When information is stored, for example, "0" and "1" are allotted in accordance with the direction of the magnetization of the second ferromagnetic layer 20.

As a specific example of the operation in the magnetic memory element 110, first the "write" operation will now be described.

FIG. 3A to FIG. 3D are schematic views illustrating the operation of the magnetic memory element according to the embodiment.

The drawings illustrate states of the first stacked unit SB1 in the "write" operation in the magnetic memory element 110. In the drawings, the second stacked unit SB2 and the third nonmagnetic layer 30n are omitted.

FIG. 3A illustrates a state where an electronic current 60 has started to be passed from the first ferromagnetic layer 10 toward the second ferromagnetic layer 20. FIG. 3B illustrates a state where passing the electronic current 60 from the first ferromagnetic layer 10 toward the second ferromagnetic layer 20 has been completed (a state where the magnetization is reversed). FIG. 3C illustrates a state where the electronic current 60 has started to be passed from the second ferromagnetic layer 20 toward the first ferromagnetic layer 10. FIG. 3D illustrates a state where passing the electronic current 60 from the second ferromagnetic layer 20 toward the first ferromagnetic layer 10 has been completed (a state where the magnetization is reversed). FIG. 3C and FIG. 3D correspond to the cases where the direction of the electronic current 60 is reversed in the cases illustrated in FIG. 3A and FIG. 3B, respectively.

In the write operation, the electronic current 60 is passed to cross the film surface of the first ferromagnetic layer 10 and the film surface of the second ferromagnetic layer 20 to perform the write operation on the second ferromagnetic layer 20. Herein, the case is described where the magnetoresistive effect via the first nonmagnetic layer 10n is a normal type.

In the magnetoresistive effect of the "normal type," the electric resistance when the magnetizations of magnetic layers on both sides of a nonmagnetic layer are parallel to each other is lower than the electric resistance when they are antiparallel. In the case of the normal type, the electric resistance between the first ferromagnetic layer 10 and the second ferromagnetic layer 20 via the first nonmagnetic layer 10n is lower when the magnetization of the first ferromagnetic layer 10 is parallel to the magnetization of the second ferromagnetic layer 20 than when antiparallel.

As shown in FIG. 3A, an electron having passed through the first ferromagnetic layer 10 having a magnetization 12a in a direction substantially perpendicular to the film surface obtains a spin in the same direction as the magnetization of the first ferromagnetic layer 10. When the electron flows into the second ferromagnetic layer 20, the angular momentum of the spin is transmitted to the second ferromagnetic layer 20 to act on the magnetization 32 of the second ferromagnetic layer 20. That is, what is called a spin-transfer torque works.

Thereby, as shown in FIG. 3B, the magnetization 32 of the second ferromagnetic layer 20 becomes in the same direction as the magnetization 12a of the first ferromagnetic layer 10. This direction is the upward direction in FIG. 3B, for example one direction parallel to the stacking direction SD1. "0", for example, is allotted to the state of the second ferromagnetic layer 20 having the magnetization 32 in this direction (the upward direction in FIG. 3B).

As shown in FIG. 3C, out of the electrons having passed through the first nonmagnetic layer 10n, an electron having a spin in the same direction as the magnetization 12a of the first ferromagnetic layer 10 (the upward direction in FIG. 3C) passes through the first ferromagnetic layer 10. On the other hand, an electron having a spin in the opposite direction to the magnetization 12a of the first ferromagnetic layer 10 (the downward direction in FIG. 3C) is reflected at the interface between the first ferromagnetic layer 10 and the first nonmagnetic layer 10n. The angular momentum of the spin of the reflected electron is transmitted to the second ferromagnetic layer 20 to act on the magnetization 32 of the second ferromagnetic layer 20.

Thereby, as shown in FIG. 3D, the magnetization 32 of the second ferromagnetic layer 20 becomes in the opposite direction to the magnetization 12a of the first ferromagnetic layer 10 (the downward direction in FIG. 3D). That is, a spin-transfer torque works. "1", for example, is allotted to the state of the second ferromagnetic layer 20 having the magnetization 32 in this direction (the downward direction in FIG. 3D).

"0" or "1" is appropriately allotted to the different states of the second ferromagnetic layer 20 based on such action. Thereby, "writing" is performed in the magnetic memory element 110.

On the other hand, in the case where the magnetoresistive effect is a "reverse type," the electric resistance between the first ferromagnetic layer 10 and the second ferromagnetic layer 20 via the first nonmagnetic layer 10n is higher when the magnetization of the first ferromagnetic layer 10 is parallel to the magnetization of the second ferromagnetic layer 20 than when antiparallel. The "write" operation in the reverse type is similar to that in the case of the normal type.

Next, the "read" operation will now be described.

The detection of the direction of the magnetization of the second ferromagnetic layer 20 in the magnetic memory element 110 is performed by, for example, utilizing the magnetoresistive effect. In the magnetoresistive effect, electric resistance changes with the relative direction of the magnetization of each layer. In the case where the magnetoresistive effect is utilized, a sense current is passed between the first ferromagnetic layer 10 and the second ferromagnetic layer 20 to measure the magnetic resistance. The current value of the sense current is smaller than the current value corresponding to the electronic current 60 of the "write" operation.

FIG. 4A and FIG. 4B are schematic views illustrating the operation of the magnetic memory element according to the embodiment.

The drawings illustrate states of the first stacked unit SB1 in the "read" operation in the magnetic memory element 110. In the drawings, the second stacked unit SB2 and the third nonmagnetic layer 30n are omitted.

FIG. 4A illustrates the case where the direction of the magnetization of the first ferromagnetic layer 10 is the same as the direction of the magnetization of the second ferromagnetic layer 20. FIG. 4B illustrates the case where the direction of the magnetization of the first ferromagnetic layer 10 is antiparallel (opposite) to the direction of the magnetization of the second ferromagnetic layer 20.

As shown in FIG. 4A and FIG. 4B, a sense current 61 is passed through the first stacked unit SB1 to detect the electric resistance.

In the magnetoresistive effect of the normal type, the resistance in the state of FIG. 4A is lower than the resistance in the state of FIG. 4B. In the magnetoresistive effect of the reverse type, the resistance in the state of FIG. 4A is higher than the resistance in the state of FIG. 4B.

By relating "0" and "1" to these states of different resistances, respectively, the memory of two value data can be read out. The direction of the sense current 61 may be opposite to the direction illustrated in FIG. 4A and FIG. 4B.

As the first ferromagnetic layer 10 and the second ferromagnetic layer 20, a metal material including at least one element selected from the group consisting of iron (Fe), cobalt (Co), nickel (Ni), manganese (Mn), and chromium (Cr), for example, is preferably used. In addition, an alloy by the combination of at least one selected from the group mentioned above and at least one element selected from the group consisting of platinum (Pt), palladium (Pd), iridium (Ir), ruthenium (Ru), and rhodium (Rh) may be used.

The characteristics of the first ferromagnetic layer 10 and the second ferromagnetic layer 20 can be adjusted by the composition of the magnetic material contained and heat treatment. Furthermore, as the first ferromagnetic layer 10 and the second ferromagnetic layer 20, an amorphous alloy of rare earth-transition metal such as TbFeCo and GdFeCo may be used. A stacked structure such as Co/Pt, Co/Pd, and Co/Ni may be used as the first ferromagnetic layer 10 and the second ferromagnetic layer 20. Co/Ru, Fe/Au, Ni/Cu, and the like become a perpendicular magnetization film depending on the combination with the underlayer. Co/Ru, Fe/Au, Ni/Cu, and the like can be used as the first ferromagnetic layer 10 and the second ferromagnetic layer 20 by controlling the crystalline orientation direction of the film. The first ferromagnetic layer 10 and the second ferromagnetic layer 20 may contain an additive such as aluminum (Al), germanium (Ge), nitrogen (N), phosphorus (P), arsenic (As), boron (B), and silicon (Si).

An insulating material functioning as a nonmagnetic tunnel barrier layer may be used as the first nonmagnetic layer 10n. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the first nonmagnetic layer 10n, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used. In addition, for example, a nonmagnetic semiconductor ($ZnO_x$, InMn, GaN, GaAs, $TiO_x$, Zn, and Te or these materials doped with a transition metal) and the like may be used as the first nonmagnetic layer 10n.

The thickness of the first nonmagnetic layer 10n is preferably set to a value in a range approximately from 0.2 nanometers (nm) to 2.0 nm. Thereby, for example, an excessive high resistance is suppressed while ensuring the uniformity of the insulating film.

As the second nonmagnetic layer 20n, for example, one of a nonmagnetic tunnel barrier layer and a nonmagnetic metal layer may be used.

An insulating material, for example, is used as the nonmagnetic tunnel barrier layer. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used as the nonmagnetic tunnel barrier layer. In addition, as the nonmagnetic tunnel barrier layer, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used.

As the nonmagnetic tunnel barrier layer, a nonmagnetic semiconductor ($ZnO_x$, InMn, GaN, GaAs, $TiO_x$, Zn, and Te or these materials doped with a transition metal) and the like may be used.

In the case where a nonmagnetic tunnel barrier layer is used as the second nonmagnetic layer 20n, the thickness of the second nonmagnetic layer 20n is preferably set to a value in a range approximately from 0.2 nm to 2.0 nm.

As the nonmagnetic metal layer used as the second nonmagnetic layer 20n, for example, a nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi) or an alloy including at least two elements selected from the group mentioned above may be used. The thickness of the second nonmagnetic layer 20n, where a nonmagnetic metal is used, is preferably made not less than 1.5 nm and not more than 20 nm. Thereby, an interlayer coupling does not occur between magnetic layers, and the loss of the spin polarization state of a conduction electron is suppressed when the conduction electron passes through the nonmagnetic metal layer.

As the third ferromagnetic layer 30, for example, a magnetic metal including at least one element selected from the group consisting of iron (Fe), cobalt (Co), nickel (Ni), manganese (Mn), and chromium (Cr) may be used. Furthermore, an alloy by the combination of at least one selected from the group mentioned above and at least one element selected from the group consisting of platinum (Pt), palladium (Pd), iridium (Ir), ruthenium (Ru), and rhodium (Rh) may be used.

The characteristics of the third ferromagnetic layer 30 can be adjusted by the composition of the magnetic material contained and heat treatment. The third ferromagnetic layer 30 may contain an additive such as aluminum (Al), germanium (Ge), nitrogen (N), phosphorus (P), arsenic (As), boron (B), and silicon (Si). In addition, as the third ferromagnetic layer 30, a stacked structure such as Co/Pt, Co/Pd, and Co/Ni may be used. Co/Ru, Fe/Au, Ni/Cu, and the like can be used as the third ferromagnetic layer 30 by controlling the crystalline orientation direction of the film.

As the fourth ferromagnetic layer 40, a metal material including at least one element selected from the group consisting of iron (Fe), cobalt (Co), nickel (Ni), manganese (Mn), and chromium (Cr) is preferably used. Furthermore, an alloy by the combination of these and at least one element selected from the group consisting of platinum (Pt), palladium (Pd), iridium (Ir), ruthenium (Ru), and rhodium (Rh) may be used.

The characteristics of the fourth ferromagnetic layer 40 can be adjusted by the composition of the magnetic material contained and heat treatment. As the fourth ferromagnetic layer 40, an amorphous alloy of rare earth-transition metal such as TbFeCo and GdFeCo may be used. In addition, as the fourth ferromagnetic layer 40, a stacked structure such as Co/Pt, Co/Pd, and Co/Ni may be used. Co/Ru, Fe/Au, Ni/Cu, and the like become a perpendicular magnetization film depending on the combination with the underlayer. Co/Ru, Fe/Au, Ni/Cu, and the like can be used as the fourth ferromagnetic layer 40 by controlling the crystalline orientation direction of the film. The fourth ferromagnetic layer 40 may contain an additive such as aluminum (Al), germanium (Ge), nitrogen (N), phosphorus (P), arsenic (As), boron (B), and silicon (Si).

A nonmagnetic metal layer is used as the third nonmagnetic layer 30n.

As the nonmagnetic metal layer used as the third nonmagnetic layer 30n, at least one nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), titanium (Ti), and osmium (Os) or an alloy including two or more elements selected from the group mentioned above may be used.

As the third nonmagnetic layer 30n, a material with a long spin diffusion length such as copper (Cu) or a material with a short spin diffusion length such as ruthenium (Ru) may be used. In the case where it is desirable to cancel the effect of spin-polarized electrons being interposed, a material with a short spin diffusion length such as ruthenium (Ru) is preferably used as the third nonmagnetic layer 30n.

As described above, in the magnetic memory element 110, a pair of electrodes (conductive layers) for passing an electronic current through the stacked body SB0 are provided.

A conductive magnetic material or a conductive nonmagnetic material is used as the electrode. Specific examples of the conductive magnetic material include a material similar to the material used as the third ferromagnetic layer 30 and the fourth ferromagnetic layer 40.

Specific examples of the conductive nonmagnetic material include a metal selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), tungsten (W), platinum (Pt), bismuth (Bi), titanium (Ti), and aluminum (Al) or an alloy including two or more selected from the group mentioned above.

In addition, as the conductive nonmagnetic material used as the electrode, a material such as carbon nanotube, carbon nanowire, and graphene is given.

As the conductive protection film provided for the electrode, a material including at least one element selected from the group consisting of tantalum (Ta), ruthenium (Ru), copper (Cu), gold (Au), silver (Ag), aluminum (Al), tungsten (W) and titanium (Ti) or a material such as graphene may be used.

As described above, the shapes of the first stacked unit SB1 and the second stacked unit SB2 when cut along a plane perpendicular to the Z-axis are arbitrary. For example, the shapes of the first stacked unit SB1 and the second stacked unit SB2 when cut along a plane perpendicular to the Z-axis (the cross-sectional shape taken along a plane parallel to the film surface) may be a circle, ellipse, flat circle, and polygon having three or more angles such as a tetragon and hexagon.

The shapes of the first stacked unit SB1 and the second stacked unit SB2 when cut along a plane parallel to the Z-axis are arbitrary. The shapes of the first stacked unit SB1 and the second stacked unit SB2 when cut along a plane parallel to the Z-axis (the cross-sectional shape taken along a plane perpendicular to the film surface) may have, for example, a tapered shape or an inverse tapered shape.

Various examples of the configuration of the magnetic memory element according to the embodiment will now be described. In the following, not-described configuration, the material of the components, and the like are similar to the structure and the material of the components described in regard to the magnetic memory element 110.

FIG. 5A to FIG. 5E are schematic cross-sectional views illustrating the configurations of magnetic memory elements according to the first embodiment.

Figure 5A:
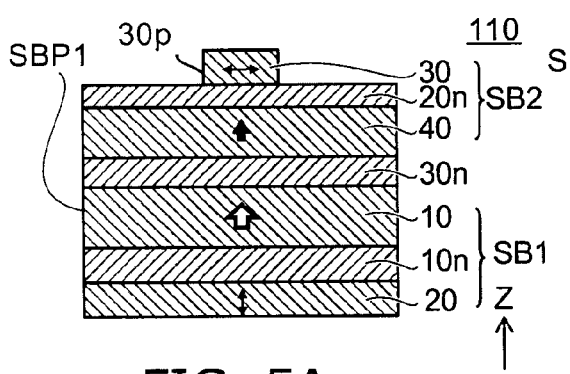
FIG. 5A to FIG. 5E are schematic cross-sectional views showing magnetic memory elements according to the first embodiment.

FIG. 5A corresponds to the magnetic memory element 110 described above. As shown in FIG. 5A to FIG. 5E, in magnetic memory elements 110 to 114 according to the embodiment, the second ferromagnetic layer 20, the first nonmagnetic layer 10n, the first ferromagnetic layer 10, the third nonmagnetic layer 30n, the fourth ferromagnetic layer 40, the second nonmagnetic layer 20n, and the third ferromagnetic layer 30 are stacked in this order. This stacking order is referred to as a first stacked configuration for the sake of convenience.

In the first stacked configuration, the first ferromagnetic layer 10 is disposed between the second ferromagnetic layer 20 and the fourth ferromagnetic layer 40, and the fourth ferromagnetic layer 40 is disposed between the first ferromagnetic layer 10 and the third ferromagnetic layer 30. The third nonmagnetic layer 30n is disposed between the first ferromagnetic layer 10 and the fourth ferromagnetic layer 40.

In these magnetic memory elements, the direction of the component in Z-axis of the magnetization fixed in the first direction (the magnetization of the first ferromagnetic layer 10) is the same as the direction of the component in Z-axis of the magnetization fixed in the second direction (the magnetization of the fourth ferromagnetic layer 40). In this example, the direction of the component in Z-axis of the magnetization of the first ferromagnetic layer 10 is the upward direction, and the direction of the component in Z-axis of the magnetization of the fourth ferromagnetic layer 40 is the upward direction. However, these directions may be the downward direction.

As shown in FIG. 5A, in the magnetic memory element 110, the cross-sectional area S30 of the third ferromagnetic layer 30 is smaller than the cross-sectional area S1 of the first stacked unit SB1. For example, the first outer edge SBP1 of the first stacked unit SB1 includes a portion outside the outer edge 30p of the third ferromagnetic layer 30. The position of the outer edge of the fourth ferromagnetic layer 40 and the position of the outer edge of the second nonmagnetic layer 20n coincide with the position of the first outer edge SBP1.

Figure 5B:
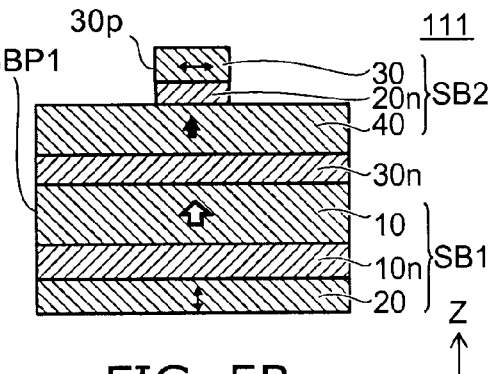

As shown in FIG. 5B, in the magnetic memory element 111, the first outer edge SBP1 of the first stacked unit SB1 includes a portion outside the outer edge 30p of the third ferromagnetic layer 30 and the outer edge of the second nonmagnetic layer 20n. The position of the outer edge of the fourth ferromagnetic layer 40 coincides with the position of the first outer edge SBP1.

Figure 5C:
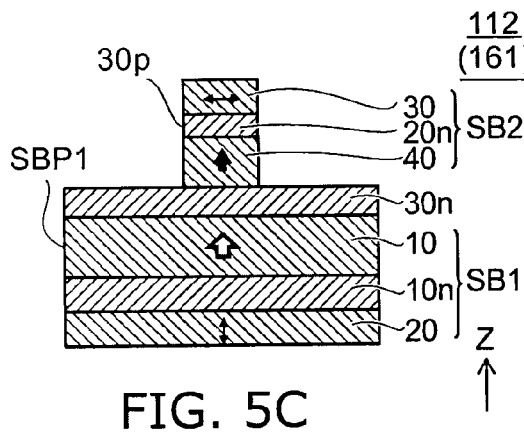

As shown in FIG. 5C, in the magnetic memory element 112, the first outer edge SBP1 of the first stacked unit SB1 includes a portion outside the outer edge 30p of the third ferromagnetic layer 30, the outer edge of the second nonmagnetic layer 20n, and the outer edge of the fourth ferromagnetic layer 40. In the magnetic memory elements 110, 111, and 112, the position of the outer edge of the third nonmagnetic layer 30n coincides with the position of the first outer edge SBP1.

Figure 5D:
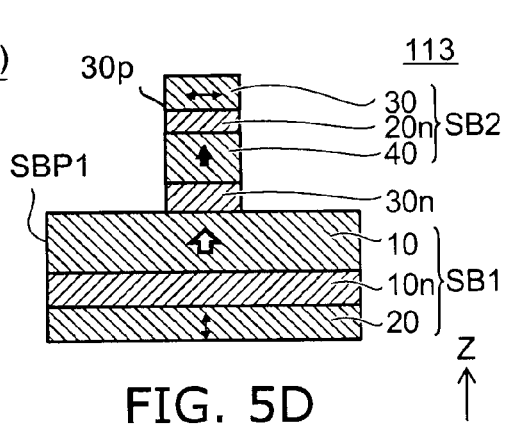

As shown in FIG. 5D, in the magnetic memory element 113, the first outer edge SBP1 of the first stacked unit SB1 includes a portion outside the outer edge 30p of the third ferromagnetic layer 30, the outer edge of the second nonmagnetic layer 20n, the outer edge of the fourth ferromagnetic layer 40, and the outer edge of the third nonmagnetic layer 30n.

Figure 5E:
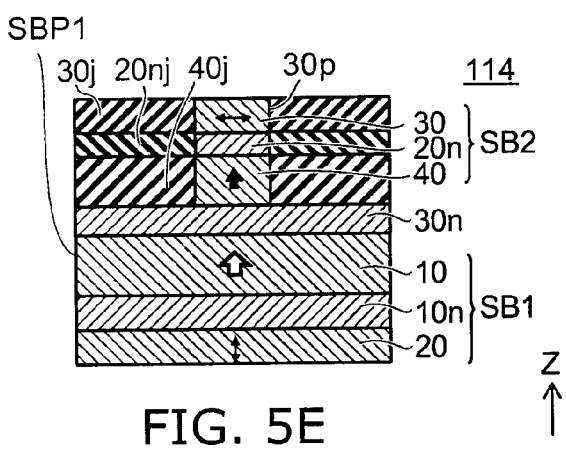
Figures 6A, 6B:
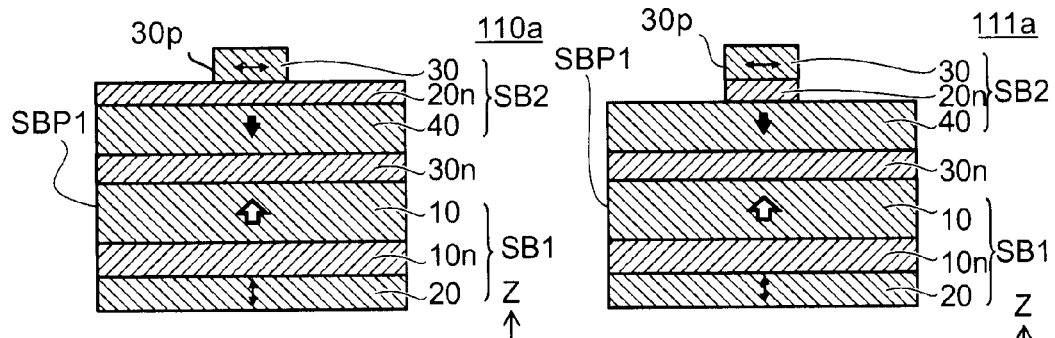
FIG. 6A to FIG. 6E are schematic cross-sectional views showing other magnetic memory elements according to the first embodiment.
Figures 6C, 6D:
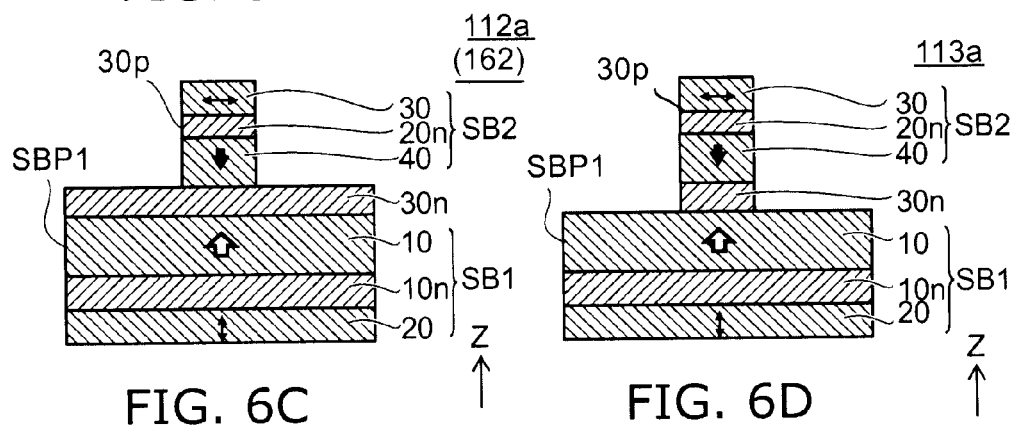
Figure 6E:
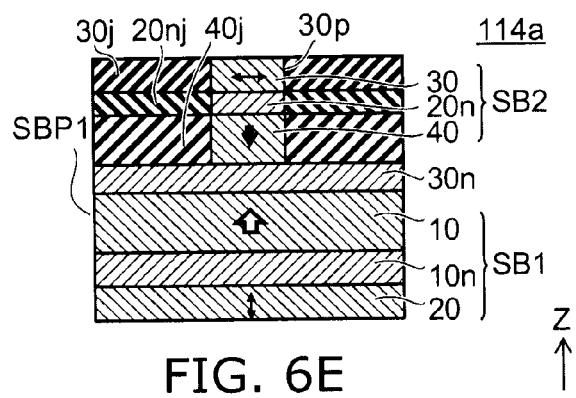

As shown in FIG. 5E, in the magnetic memory element 114, in a plane perpendicular to the Z-axis, a third ferromagnetic layer surrounding unit 30j, a second nonmagnetic layer surrounding unit 20nj, and a fourth ferromagnetic layer surrounding unit 40j are provided around the third ferromagnetic layer 30, the second nonmagnetic layer 20n, and the fourth ferromagnetic layer 40, respectively. For example, the third ferromagnetic layer 30 and the third ferromagnetic layer surrounding unit 30j are formed of a film for the third ferromagnetic layer, and the third ferromagnetic layer surrounding unit 30j is obtained by magnetically inactivating the film for the third ferromagnetic layer. Furthermore, the third ferromagnetic layer surrounding unit 30j is obtained by making the film for the third ferromagnetic layer substantially electrically insulative. The Bs (saturation magnetic flux density) in the third ferromagnetic layer surrounding unit 30j is 10% or less of the Bs in the third ferromagnetic layer 30. The electric conductivity in the third ferromagnetic layer surrounding unit 30j is 10% or less of the electric conductivity in the third ferromagnetic layer 30.

The magnetic memory element 114 has had a configuration in which the cross-sectional area S30 of the third ferromagnetic layer 30 is smaller than the cross-sectional area S1 of the first stacked unit SB1. For example, the first outer edge SBP1 of the first stacked unit SB1 includes a portion substantially outside the outer edge 30p of the third ferromagnetic layer 30, the outer edge of the second nonmagnetic layer 20n, and the outer edge of the fourth ferromagnetic layer 40.

At least one of the third ferromagnetic layer surrounding unit 30j, the second nonmagnetic layer surrounding unit 20nj, and the fourth ferromagnetic layer surrounding unit 40j may be provided in the magnetic memory elements 110, 111, and 113.

FIG. 6A to FIG. 6E are schematic cross-sectional views illustrating the configurations of other magnetic memory elements according to the first embodiment.

As shown in FIG. 6A to FIG. 6E, the stacking order of the layers in magnetic memory elements 110a to 114a is the same as that in the magnetic memory elements 110 to 114. In the magnetic memory elements 110a to 114a, the direction of the component in Z-axis of the magnetization fixed in the first direction (the magnetization of the first ferromagnetic layer 10) is opposite to the direction of the component in Z-axis of the magnetization fixed in the second direction (the magnetization of the fourth ferromagnetic layer 40).

In the configurations of the magnetic memory elements 110a to 114a, the direction of the rotating magnetic field generated from the third ferromagnetic layer 30 agrees with the direction in which the magnetization of the second ferromagnetic layer 20 precesses. The rotating magnetic field generated from the third ferromagnetic layer 30 acts more effectively on the second ferromagnetic layer 20. This can assist the magnetization reversal of the second ferromagnetic layer 20 more efficiently. Thereby, the current necessary for writing to the second ferromagnetic layer 20 can be more reduced.

The relative relationships among the widths of the layers in the magnetic memory elements 110a to 114a are similar to those in the magnetic memory elements 110 to 114, and a description is therefore omitted. As illustrated in the magnetic memory element 114a, also in this case, at least one of the third ferromagnetic layer surrounding unit 30j, the second nonmagnetic layer surrounding unit 20nj, and the fourth ferromagnetic layer surrounding unit 40j may be provided.

Figure 7A:
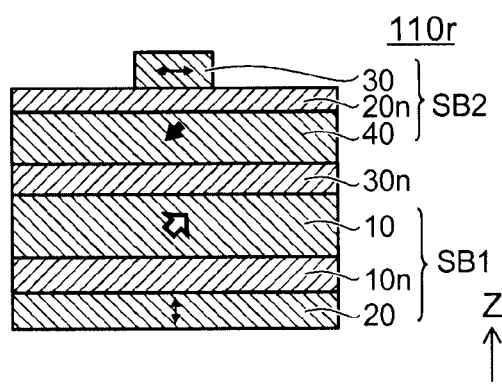
FIG. 7A and FIG. 7B are schematic cross-sectional views showing other magnetic memory elements according to the first embodiment.
Figure 7B:
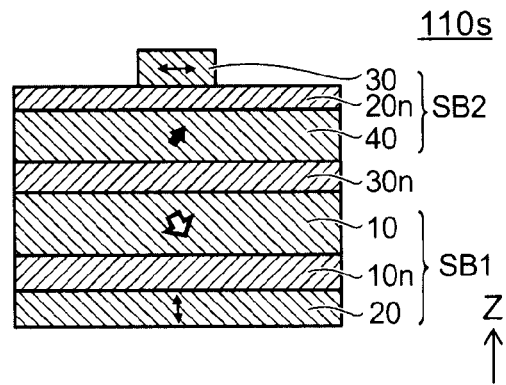
Figure 8A:
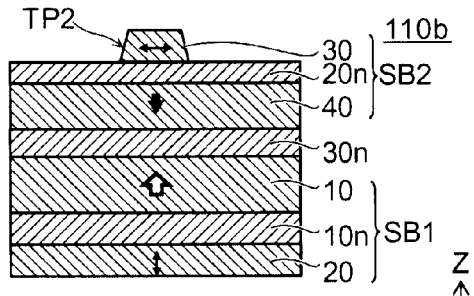
FIG. 8A to FIG. 8H are schematic cross-sectional views showing other magnetic memory elements according to the first embodiment.
Figure 8B:
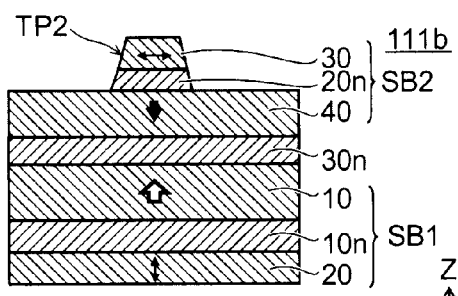
Figure 8C:
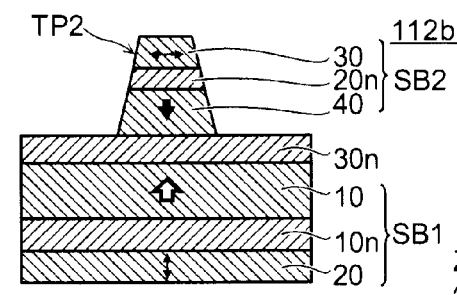
Figure 8D:
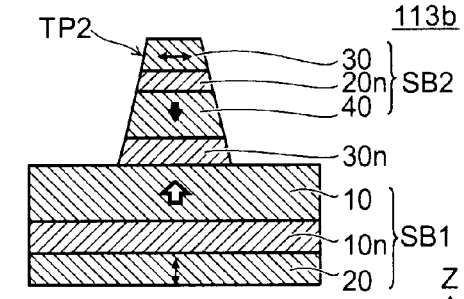
Figure 8E:
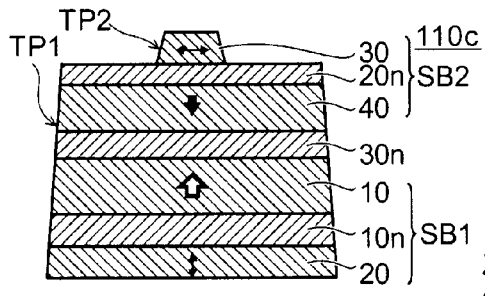
Figure 8F:
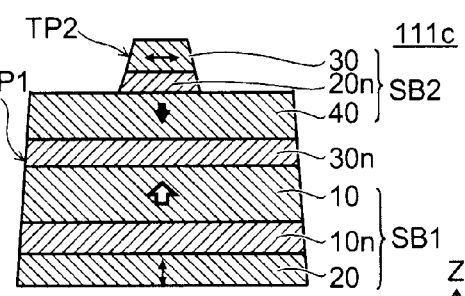
Figure 8G:
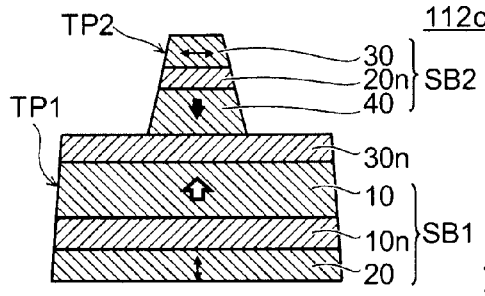
Figure 8H:
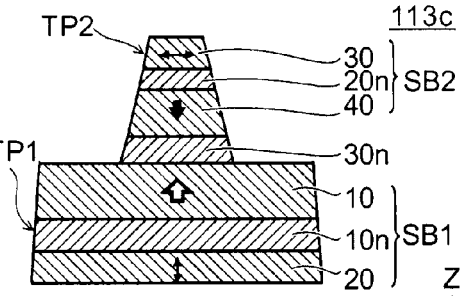

FIG. 7A and FIG. 7B are schematic cross-sectional views illustrating the configurations of other magnetic memory elements according to the first embodiment.

As shown in FIG. 7A and FIG. 7B, in magnetic memory elements 110r and 110s, the direction of the magnetization of the first ferromagnetic layer 10 and the direction of the magnetization of the fourth ferromagnetic layer 40 are oblique to the film surface.

Also in this case, the direction of the component in Z-axis of the magnetization fixed in the first direction (the magnetization of the first ferromagnetic layer 10) is opposite to the direction of the component in Z-axis of the magnetization fixed in the second direction (the magnetization of the fourth ferromagnetic layer 40).

In the case where the direction of the component in Z-axis of the magnetization fixed in the first direction is opposite to the direction of the component in Z-axis of the magnetization fixed in the second direction, the stray magnetic field applied in the direction perpendicular to the film surface in the position of the second ferromagnetic layer 20 can be reduced. That is, the stray magnetic field applied in the direction perpendicular to the film surface in the position of the second ferromagnetic layer 20 can be cancelled. On the other hand, the stray magnetic field applied in the direction perpendicular to the film surface in the position of the third ferromagnetic layer 30 can be caused to remain and act.

Thereby, the direction of the rotating magnetic field generated from the third ferromagnetic layer 30 agrees with the direction in which the magnetization of the second ferromagnetic layer 20 precesses. The rotating magnetic field generated from the third ferromagnetic layer 30 can assist the magnetization reversal of the second ferromagnetic layer 20 efficiently. As a result, the current necessary for storing (writing) information into the second ferromagnetic layer 20 can be reduced.

The configuration in which the direction of the magnetization of the first ferromagnetic layer 10 and the direction of the magnetization of the fourth ferromagnetic layer 40 are oblique to the film surface can be applied to the magnetic memory elements 110 to 114 and 110a to 114a, modifications thereof, and any of the magnetic memory elements according to the embodiment described later.

In the magnetic memory elements 110a to 114a and 110r and 110s, the first ferromagnetic layer 10 and the fourth ferromagnetic layer 40 may be coupled antiferromagnetically via the third nonmagnetic layer 30n. Such a structure in which mutual magnetization are coupled antiferromagnetically via a nonmagnetic layer to become antiparallel is called a synthetic anti-ferromagnet (SAF) structure. In this example, the stacked structure of "a first magnetic layer (e.g. the first ferromagnetic layer 10)/a nonmagnetic layer (e.g. the third nonmagnetic layer 30n)/a second magnetic layer (e.g. the fourth ferromagnetic layer 40)" corresponds to the SAF structure.

Using the SAF structure can enhance the mutual magnetization fixing strength and increase resistance to external magnetic fields and thermal stability. In the structure, the stray magnetic field applied in the direction perpendicular to the film surface in the position of the magnetic memory layer (e.g. the second ferromagnetic layer 20) can be made almost zero.

A metal material such as ruthenium (Ru), iridium (Ir), and osmium (Os) is used as the nonmagnetic layer (intermediate layer) of the SAF structure. The thickness of the nonmagnetic layer is set not more than 3 nm. Thereby, a sufficiently strong antiferromagnetic coupling is obtained via the nonmagnetic layer.

That is, the third nonmagnetic layer 30n preferably contains a metal selected from the group consisting of ruthenium (Ru), osmium (Os), and iridium (Ir) or an alloy including at least two selected from the group, and the thickness of the third nonmagnetic layer 30n is preferably not more than 3 nm.

In the foregoing, an example is described in which the side surface of the first stacked unit SB1 and the side surface of the second stacked unit SB2 are parallel to the Z-axis, but the embodiment is not limited thereto.

FIG. 8A to FIG. 8H are schematic cross-sectional views illustrating the configurations of other magnetic memory elements according to the first embodiment.

As shown in FIG. 8A to FIG. 8D, in magnetic memory elements 110b to 113b, the side surfaces of the layers included in the second stacked unit SB2 are oblique to the Z-axis. In this example, the side surface of the first stacked unit SB1 is substantially perpendicular to the Z-axis.

In the magnetic memory element 110b, the side surface of the third ferromagnetic layer 30 is oblique to the Z-axis. In the magnetic memory element 111b, the side surface of the third ferromagnetic layer 30 and the side surface of the second nonmagnetic layer 20n are oblique to the Z-axis. In the magnetic memory element 112b, the side surface of the third ferromagnetic layer 30, the side surface of the second nonmagnetic layer 20n, and the side surface of the fourth ferromagnetic layer 40 are oblique to the Z-axis. In the magnetic memory element 113b, the side surface of the third ferromagnetic layer 30, the side surface of the second nonmagnetic layer 20n, the side surface of the fourth ferromagnetic layer 40, and the side surface of the third nonmagnetic layer 30n are oblique to the Z-axis.

In these examples, the side surfaces mentioned above are oblique so that the width (the length along an axis perpendicular to the Z-axis) of a first portion of the second stacked unit SB2 near to the first stacked unit SB1 may be larger than the width (the length along an axis perpendicular to the Z-axis) of a second portion of the second stacked unit SB2 that is more distant from the first stacked unit SB1 than the first portion is. However, the embodiment is not limited thereto, but the side surfaces mentioned above may be oblique so that the width of the first portion may be smaller than the width of the second portion.

As shown in FIG. 8E to FIG. 8H, in magnetic memory elements 110c to 113c, the side surface of the first stacked unit SB1 is oblique to the Z-axis. Other than this, the configurations of the magnetic memory elements 110c to 113c are similar to the configurations of the magnetic memory elements 110b to 113b.

In these examples, the side surfaces mentioned above are oblique so that the width (the length along an axis perpendicular to the Z-axis) of a third portion of the first stacked unit SB1 near to the second stacked unit SB2 may be smaller than the width (the length along an axis perpendicular to the Z-axis) of a fourth portion of the first stacked unit SB1 that is more distant from the second stacked unit SB2 than the third portion is. However, the embodiment is not limited thereto, but the side surfaces mentioned above may be oblique so that the width of the third portion may be larger than the width of the fourth portion.

In the case where the side surface of the first stacked unit SB1 is thus oblique to the Z-axis (in the case of a tapered shape), it is assumed that the width (e.g. the first diameter D1) of the first stacked unit SB1 is the average value of the width (diameter) of the first ferromagnetic layer 10 and the width (diameter) of the second ferromagnetic layer 20. Similarly, in the case where the side surface of the second stacked unit SB2 is oblique to the Z-axis, it is assumed that the width of the second stacked unit SB2 is the average value of the width D30 (diameter) of the third ferromagnetic layer 30 and the width (diameter) of the fourth ferromagnetic layer 40. In the case where the side surface of the third ferromagnetic layer 30 is oblique to the Z-axis, it is assumed that the width D30 of the third ferromagnetic layer 30 is the value obtained by averaging along the Z-axis the length along an axis perpendicular to the Z-axis of the third ferromagnetic layer 30.

FIG. 9A to FIG. 9H are schematic cross-sectional views illustrating the configurations of other magnetic memory elements according to the first embodiment.

As shown in FIG. 9A to FIG. 9H, in magnetic memory elements 120 to 127 according to the embodiment, the first ferromagnetic layer 10, the first nonmagnetic layer 10n, the second ferromagnetic layer 20, the third nonmagnetic layer 30n, the third ferromagnetic layer 30, the second nonmagnetic layer 20n, and the fourth ferromagnetic layer 40 are stacked in this order. This stacking order is referred to as a second stacked configuration for the sake of convenience.

In the second stacked configuration, the second ferromagnetic layer 20 is disposed between the first ferromagnetic layer 10 and the third ferromagnetic layer 30, and the third ferromagnetic layer 30 is disposed between the second ferromagnetic layer 20 and the fourth ferromagnetic layer 40. The third nonmagnetic layer 30n is disposed between the second ferromagnetic layer 20 and the third ferromagnetic layer 30.

As shown in FIG. 9A and FIG. 9H, in the magnetic memory elements 120 and 127, the cross-sectional area S30 of the third ferromagnetic layer 30 is smaller than the cross-sectional area S1 of the first stacked unit SB1. For example, the first outer edge SBP1 includes a portion outside the outer edge 30p of the third ferromagnetic layer 30. The position of the outer edge of the fourth ferromagnetic layer 40 and the position of the outer edge of the second nonmagnetic layer 20n coincide with the position of the first outer edge SBP1. The direction of the component in Z-axis of the magnetization of the first ferromagnetic layer 10 and the direction of the component in Z-axis of the magnetization of the fourth ferromagnetic layer 40 in the magnetic memory element 127 are opposite to the directions thereof in the magnetic memory element 120, respectively.

As shown in FIG. 9B, in the magnetic memory element 121, the first outer edge SBP1 includes a portion outside the outer edge 30p of the third ferromagnetic layer 30 and the outer edge of the third nonmagnetic layer 30n. The position of the outer edge of the second nonmagnetic layer 20n and the position of the outer edge of the fourth ferromagnetic layer 40 coincide with the position of the first outer edge SBP1.

As shown in FIG. 9C, in the magnetic memory element 122, the first outer edge SBP1 includes a portion outside the outer edge 30p of the third ferromagnetic layer 30 and the outer edge of the second nonmagnetic layer 20n.

As shown in FIG. 9D, in the magnetic memory element 123, the first outer edge SBP1 includes a portion outside the outer edge 30p of the third ferromagnetic layer 30, the outer edge of the second nonmagnetic layer 20n, and the outer edge of the third nonmagnetic layer 30n. The position of the outer edge of the fourth ferromagnetic layer 40 coincides with the position of the first outer edge SBP1.

As shown in FIG. 9E, in the magnetic memory element 124, the first outer edge SBP1 includes a portion outside the outer edge 30p of the third ferromagnetic layer 30, the outer edge of the second nonmagnetic layer 20n, and the outer edge of the fourth ferromagnetic layer 40.

As shown in FIG. 9F, in the magnetic memory element 125, the first outer edge SBP1 includes a portion outside the outer edge 30p of the third ferromagnetic layer 30, the outer edge of the second nonmagnetic layer 20n, the outer edge of the fourth ferromagnetic layer 40, and the outer edge of the third nonmagnetic layer 30n.

As shown in FIG. 9G, in the magnetic memory element 126, the third ferromagnetic layer surrounding unit 30j, the second nonmagnetic layer surrounding unit 20nj, and the fourth ferromagnetic layer surrounding unit 40j are provided.

At least one of the third ferromagnetic layer surrounding unit 30j, the second nonmagnetic layer surrounding unit 20nj, and the fourth ferromagnetic layer surrounding unit 40j may be provided in the magnetic memory elements 120 to 125 and 127.

FIG. 10A to FIG. 10F are schematic cross-sectional views illustrating the configurations of other magnetic memory elements according to the first embodiment.

As shown in FIG. 10A to FIG. 10F, in magnetic memory elements 130 to 135 according to the embodiment, the first ferromagnetic layer 10, the first nonmagnetic layer 10n, the second ferromagnetic layer 20, the third nonmagnetic layer 30n, the fourth ferromagnetic layer 40, the second nonmagnetic layer 20n, and the third ferromagnetic layer 30 are stacked in this order. This stacking order is referred to as a third stacked configuration for the sake of convenience.

In the third stacked configuration, the second ferromagnetic layer 20 is disposed between the first ferromagnetic layer 10 and the fourth ferromagnetic layer 40, and the fourth ferromagnetic layer 40 is disposed between the second ferromagnetic layer 20 and the third ferromagnetic layer 30. The third nonmagnetic layer 30n is disposed between the second ferromagnetic layer 20 and the fourth ferromagnetic layer 40.

Figure 10A:
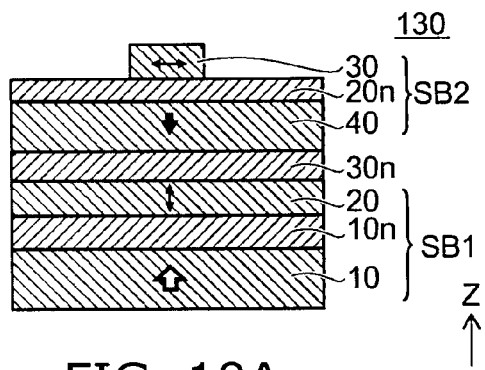
FIG. 10A to FIG. 10F are schematic cross-sectional views showing other magnetic memory elements according to the first embodiment.
Figure 10B:
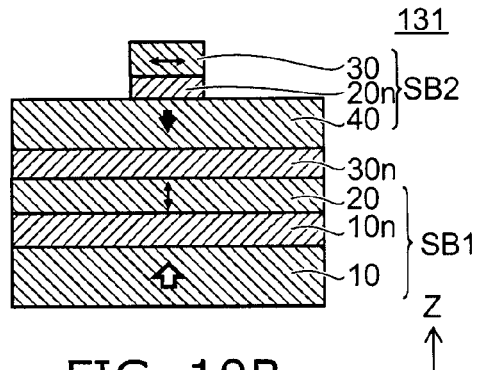
Figure 10C:
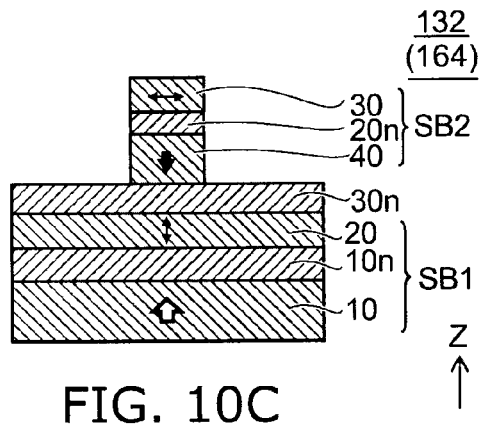
Figure 10D:
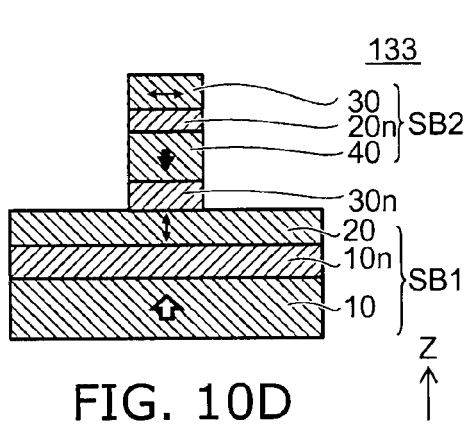
Figure 10E:
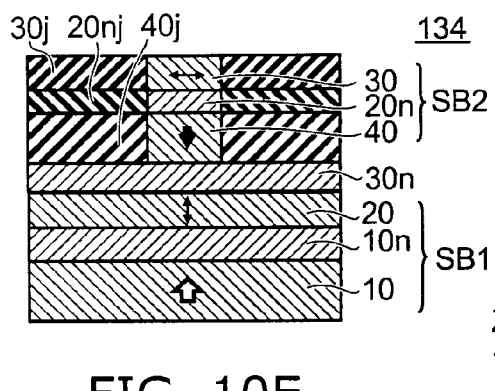

As shown in FIG. 10A to FIG. 10E, the relationships among the widths of the layers in the magnetic memory elements 130 to 134 are the same as the relationships among the widths of the layers in the magnetic memory elements 110 to 114 (and the magnetic memory elements 110a to 114a), respectively. As shown in FIG. 10E, in the magnetic memory element 134, the third ferromagnetic layer surrounding unit 30j, the second nonmagnetic layer surrounding unit 20nj, and the fourth ferromagnetic layer surrounding unit 40j are provided. Also in the magnetic memory elements 110 to 133 and 135, at least one of the third ferromagnetic layer surrounding unit 30j, the second nonmagnetic layer surrounding unit 20nj, and the fourth ferromagnetic layer surrounding unit 40j may be provided.

Figure 10F:
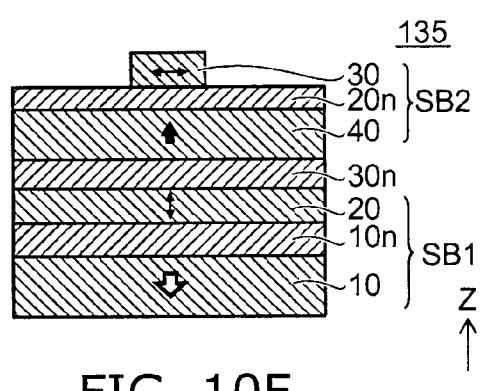

As shown in FIG. 10F, the direction of the component in Z-axis of the magnetization of the first ferromagnetic layer 10 and the direction of the component in Z-axis of the magnetization of the fourth ferromagnetic layer 40 in the magnetic memory element 135 are opposite to the directions thereof in the magnetic memory element 130, respectively.

FIG. 11A to FIG. 11H are schematic cross-sectional views illustrating the configurations of other magnetic memory elements according to the first embodiment.

As shown in FIG. 11A to FIG. 11H, in magnetic memory elements 140 to 147 according to the embodiment, the second ferromagnetic layer 20, the first nonmagnetic layer 10n, the first ferromagnetic layer 10, the third nonmagnetic layer 30n, the third ferromagnetic layer 30, the second nonmagnetic layer 20n, and the fourth ferromagnetic layer 30 are stacked in this order. This stacking order is referred to as a fourth stacked configuration for the sake of convenience.

In the fourth stacked configuration, the first ferromagnetic layer 10 is disposed between the second ferromagnetic layer 20 and the third ferromagnetic layer 30, and the third ferromagnetic layer 30 is disposed between the first ferromagnetic layer 10 and the fourth ferromagnetic layer 40. The third nonmagnetic layer 30n is disposed between the first ferromagnetic layer 10 and the third ferromagnetic layer 30.

As shown in FIG. 11A to FIG. 11G, the relationships among the widths of the layers in the magnetic memory elements 140 to 146 are the same as the relationships among the widths of the layers in the magnetic memory elements 120 to 126, respectively.

As shown in FIG. 11G, in the magnetic memory element 146, the third ferromagnetic layer surrounding unit 30j, the second nonmagnetic layer surrounding unit 20nj, and the fourth ferromagnetic layer surrounding unit 40j are provided. Also in the magnetic memory elements 141 to 145 and 147, at least one of the third ferromagnetic layer surrounding unit 30j, the second nonmagnetic layer surrounding unit 20nj, and the fourth ferromagnetic layer surrounding unit 40j may be provided.

As shown in FIG. 11H, the direction of the component in Z-axis of the magnetization of the first ferromagnetic layer 10 and the direction of the component in Z-axis of the magnetization of the fourth ferromagnetic layer 40 in the magnetic memory element 147 are opposite to the directions thereof in the magnetic memory element 140, respectively.

In the magnetic memory elements 120 to 126 (examples of the second stacked configuration), the magnetic memory elements 130 to 134 (examples of the third stacked configuration), and the magnetic memory elements 140 to 146 (examples of the fourth stacked configuration) mentioned above, the direction of the component in Z-axis of the magnetization of the first ferromagnetic layer 10 is opposite to the direction of the component in Z-axis of the magnetization of the fourth ferromagnetic layer 40. That is, in these examples, the direction of the component in Z-axis of the magnetization of the first ferromagnetic layer 10 is the upward direction, and the direction of the component in Z-axis of the magnetization of the fourth ferromagnetic layer 40 is the downward direction.

In the magnetic memory element 127 (an example of the second stacked configuration), the magnetic memory element 135 (an example of the third stacked configuration), and the magnetic memory element 147 (an example of the fourth stacked configuration), the direction of the component in Z-axis of the magnetization of the first ferromagnetic layer 10 is the downward direction, and the direction of the component in Z-axis of the magnetization of the fourth ferromagnetic layer 40 is the upward direction. The relative relationships among the widths of the layers in the magnetic memory elements 121 to 126, the magnetic memory elements 131 to 134, and the magnetic memory elements 140 to 146 may be applied to the configuration in which the direction of the component in Z-axis of the magnetization of the first ferromagnetic layer 10 is the downward direction and the direction of the component in Z-axis of the magnetization of the fourth ferromagnetic layer 40 is the upward direction.

In these configurations in which the direction of the component in Z-axis of the magnetization of the first ferromagnetic layer 10 is opposite to the direction of the component in Z-axis of the magnetization of the fourth ferromagnetic layer 40, the direction of the rotating magnetic field generated in the third ferromagnetic layer 30 can agree with the direction in which the magnetization of the second ferromagnetic layer 20 precesses. The rotating magnetic field generated from the third ferromagnetic layer 30 acts more effectively on the second ferromagnetic layer 20 and assists the magnetization reversal of the second ferromagnetic layer 20 more efficiently. Thereby, the current necessary for writing can be more reduced.

In the second stacked configuration, the third stacked configuration, and the fourth stacked configuration, the direction of the component in Z-axis of the magnetization of the first ferromagnetic layer 10 may be the same as the direction of the component in Z-axis of the magnetization of the fourth ferromagnetic layer 40. For example, these directions may be the upward direction or the downward direction.

In the second stacked configuration, the third stacked configuration, and the fourth stacked configuration mentioned above, the directions of the magnetization of the first ferromagnetic layer 10 and the magnetization of the fourth ferromagnetic layer 40 may be oblique to the film surface.

The distance between the second ferromagnetic layer 20 and the third ferromagnetic layer 30 in the second stacked configuration (e.g. the magnetic memory elements 120 to 127 and modifications thereof) is shorter than that in the first stacked configuration (e.g. the magnetic memory elements 110 to 114 and 110a to 114a, and modifications thereof). Thereby, the rotating magnetic field generated in the third ferromagnetic layer 30 can act on the second ferromagnetic layer 20 more and assist the magnetization reversal of the second ferromagnetic layer 20 more efficiently. Thereby, the current necessary for writing to the second ferromagnetic layer can be more reduced.

In the second stacked configuration, if the spin information is kept in the third nonmagnetic layer 30n, the third ferromagnetic layer 30 is affected by the spin-transfer torque from the second ferromagnetic layer 20. This may cause a decrease in the controllability of the magnetization rotation of the third ferromagnetic layer 30.

At this time, as the third nonmagnetic layer 30n, a film with a short spin diffusion length such as, for example, ruthenium (Ru) (a material having the function of spin cancel) or a layer having a structure with a short spin diffusion length is preferably used. This can suppress the decrease in the controllability of the magnetization rotation of the third ferromagnetic layer 30.

That is, the magnitude of the spin-transfer torque for the magnetization of the third ferromagnetic layer 30 to precess is determined by the spin polarization in the fourth ferromagnetic layer 40. In this configuration, the magnetization of the third ferromagnetic layer 30 can be independently controlled without being affected by the spin of other electrons (spin-transfer torque).

As the material of the third nonmagnetic layer 30n providing such a spin cancel effect, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more selected from the group can be given.

The thickness of the third nonmagnetic layer 30n is preferably set to a value that does not cause an interlayer magnetic coupling between the second ferromagnetic layer 20 and the third ferromagnetic layer 30. Specifically, the thickness of the third nonmagnetic layer 30n is preferably set not less than 1.4 nm.

If the thickness of the third nonmagnetic layer 30n is not less than 1.4 nm, the second ferromagnetic layer 20 and the third ferromagnetic layer 30 are not interlayer-coupled, and the spin polarization degree can be cancelled in the third nonmagnetic layer 30n when conduction electrons pass through the interior and interface of the third nonmagnetic layer 30n. Furthermore, the third nonmagnetic layer 30n can prevent the precession of the third ferromagnetic layer 30 from changing due to the direction of the magnetization of the second ferromagnetic layer 20.

On the other hand, if the thickness of the third nonmagnetic layer 30n exceeds 20 nm, the pillar formation of a multiple-layer film is difficult. Furthermore, the strength of the rotating magnetic field generated from the third ferromagnetic layer 30 decreases in the position of the second ferromagnetic layer 20. Therefore, the thickness of the third nonmagnetic layer 30n is preferably set not more than 20 nm.

As the third nonmagnetic layer 30n, a stacked film may be used as well as the single-layer film described above. The stacked film may have, for example, a stacked configuration of the following layers: a layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more selected from the group; and a copper (Cu) layer stacked at least on one side of the layer.

In addition, the stacked film used as the third nonmagnetic layer 30n may have, for example, a stacked configuration including the following layers: a first layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more selected from the group; and a second layer stacked at least on one side of the first layer and containing an oxide including at least one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru).

Also in the fourth stacked configuration (e.g. the magnetic memory elements 140 to 147 and modifications thereof), the distance between the second ferromagnetic layer 20 and the third ferromagnetic layer 30 is shorter than that in the first stacked configuration. Due to the short distance, the magnetic field increases to enhance the assist effect, and the current necessary for writing to the second ferromagnetic layer 20 can be more reduced.

In the fourth stacked configuration, the direction of the spin polarization of the electron injected into the third ferromagnetic layer 30 is the same as the direction of the spin polarization in the fourth ferromagnetic layer 40 and the direction of the spin polarization in the first ferromagnetic layer 10.

Thereby, for example, the efficiency of the generation of the rotating magnetic field generated in the third ferromagnetic layer 30 improves.

As the third nonmagnetic layer 30n and the second nonmagnetic layer 20n, a metal conductor, insulator, or semiconductor may be used. Layers based on different materials may be used as the third nonmagnetic layer 30n and the second nonmagnetic layer 20n.

In the case where an insulator or a semiconductor is used as the third nonmagnetic layer 30n, the resistance value increases. Therefore, in this case, a metal conductor is preferably used as the second nonmagnetic layer 20n. As the metal conductor, copper (Cu), aluminum (Al), silver (Ag), gold (Au), and the like are preferably used.

In the third stacked configuration (the magnetic memory elements 130 to 135 and modifications thereof), the distance between the second ferromagnetic layer 20 and the third ferromagnetic layer 30 is shorter than that in the first stacked configuration. Due to the short distance, the magnetic field increases to enhance the assist effect, and the current necessary for writing to the second ferromagnetic layer 20 can be more reduced.

In the third stacked configuration, the direction of the spin polarization of the electron injected into the second ferromagnetic layer 20 is the same as the direction of the spin polarization in the fourth ferromagnetic layer 40 and the direction of the spin polarization in the first ferromagnetic layer 10. Thereby, the efficiency of the magnetization reversal of the second ferromagnetic layer 20 is increased.

In the third stacked configuration, materials similar to the materials described in regard to the fourth stacked configuration may be used as the third nonmagnetic layer 30n and the second nonmagnetic layer 20n.

In the second to fourth stacked configuration mentioned above, as described in regard to FIG. 8A to FIG. 8H, the side surfaces of the layers may be oblique to the Z-axis.

The magnetic memory element according to the embodiment may further include a magnetic shield. Examples of the configuration of the magnetic shield will now be described.

FIG. 12A to FIG. 12D are schematic cross-sectional views illustrating the configurations of other magnetic memory elements according to the first embodiment.

Figure 12A:
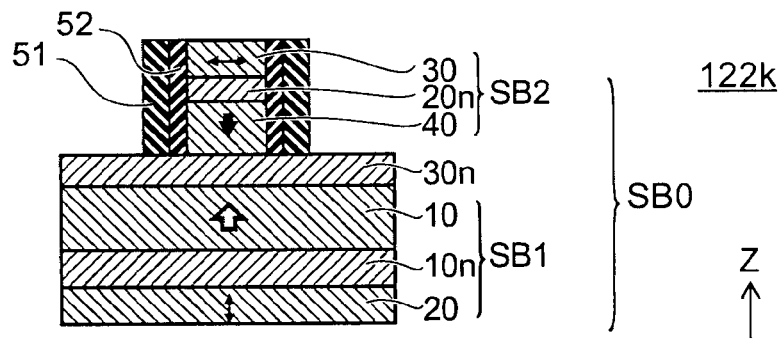
FIG. 12A to FIG. 12D are schematic cross-sectional views showing other magnetic memory elements according to the first embodiment.
Figure 12B:
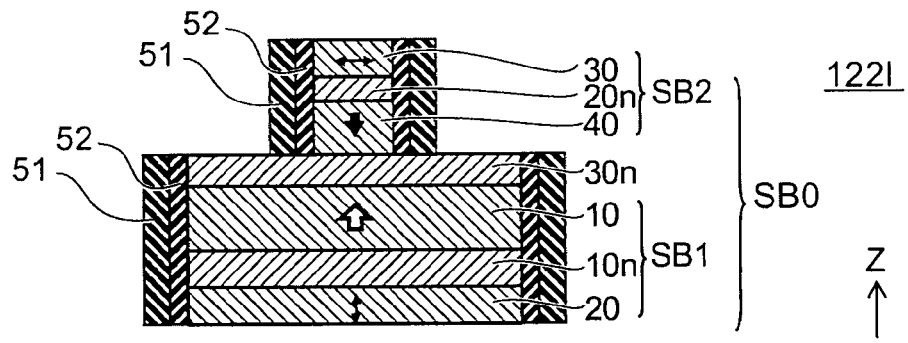

As shown in FIG. 12A and FIG. 12B, in magnetic memory elements 122k and 122l according to the embodiment, a magnetic shield 51 opposed to the side surface of the second stacked unit SB2 is provided. In the magnetic memory element 122l, the magnetic shield 51 is further opposed to the side surface of the first stacked unit SB1 and the side surface of the third nonmagnetic layer 30n.

That is, the magnetic memory elements 122k and 122l further include the magnetic shield 51 opposed to at least part of the side surface of the stacked body SB0. The magnetic shield 51 covers the above-mentioned at least part of the side surface of the stacked body SB0.

In addition, the magnetic memory elements 122k and 122l further include a protection layer 52 provided between the above-mentioned at least part of the side surface of the stacked body SB0 and the magnetic shield 51.

In the magnetic memory element 122k, the magnetic shield 51 covers the side surface of the second stacked unit SB2.

In the magnetic memory element 122l, the magnetic shield 51 covers the side surface of the second stacked unit SB2, the side surface of the first stacked unit SB1, and the side surface of the third nonmagnetic layer 30n.

Figure 12C:
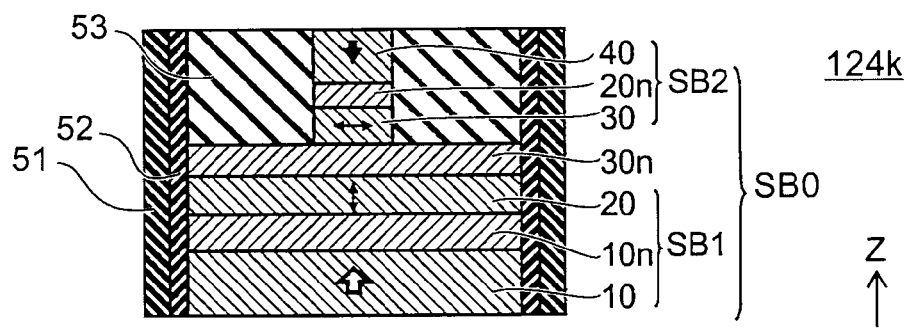
Figure 12D:
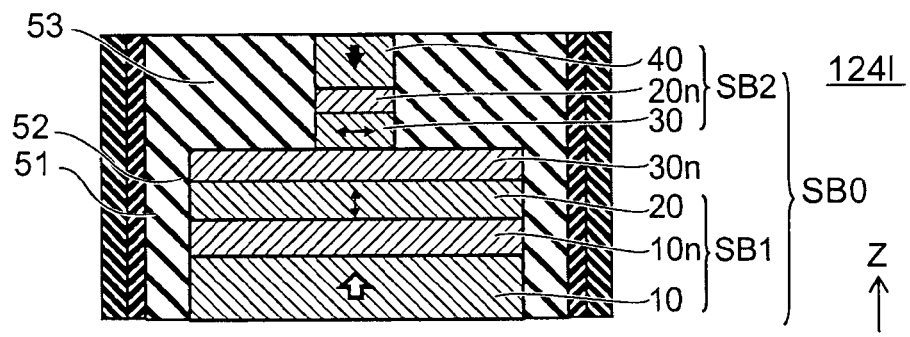

As shown in FIG. 12C and FIG. 12D, also in magnetic memory elements 124k and 124l according to the embodiment, the magnetic shield 51 opposed to the side surface of the second stacked unit SB2 is provided. The magnetic shield 51 is further opposed to the side surface of the first stacked unit SB1. The magnetic memory elements 124k and 124l further include the protection layer 52 provided between at least part of the side surface of the stacked body SB0 and the magnetic shield 51. The magnetic memory elements 124k and 124l further include an insulating layer 53 (embedded insulating layer) provided between the protection layer 52 and the third ferromagnetic layer 30 (in this example, between the protection layer 52 and the second stacked unit SB2). In the magnetic memory element 124l, the insulating layer 53 is provided also between the first stacked unit SB1 and the protection layer 52. An insulating material such as, for example, silicon oxide, silicon nitride, and silicon oxynitride is used as the insulating layer 53. By providing the insulating layer 53, the distance between the second stacked unit SB2 and the magnetic shield 51 is increased, and the magnetic field generated from the second stacked unit SB2 is easily applied to the first stacked unit SB1 to facilitate obtaining the high frequency assist effect.

For example, the side surface of the first stacked unit SB1 and the side surface of the second stacked unit SB2 are covered with the magnetic shield 51 such as a permalloy (Py) via the protection layer 52 such as, for example, SiN or $Al_2O_3$.

Thereby, in the case where a plurality of magnetic memory elements are arranged, the possibility is decreased that the stray magnetic field from an adjacent magnetic memory element affects the operation of the first stacked unit SB1 and the second stacked unit SB2. Thereby, the current injection amount necessary to generate the rotating magnetic field can be reduced. Furthermore, the possibility can be decreased that the stray magnetic field from the first stacked unit SB1 and the second stacked unit SB2 acts on an adjacent magnetic memory element. As a consequence, the plurality of magnetic memory elements can be closely arranged to improve the integration degree.

As the protection layer 52, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the magnetic shield 51, an element selected from the group consisting of iron (Fe), cobalt (Co), nickel (Ni), manganese (Mn), and chromium (Cr) or an alloy including two or more selected from the group may be used.

In addition, as the magnetic shield 51, an alloy by the combination of at least one element selected from the group consisting of iron (Fe), cobalt (Co), nickel (Ni), manganese (Mn), and chromium (Cr) and at least one element selected from the group consisting of platinum (Pt), palladium (Pd), iridium (Ir), ruthenium (Ru), and rhodium (Rh) may be used.

The characteristics of the magnetic shield 51 can be adjusted by the composition of the magnetic material contained in the magnetic shield 51 and heat treatment. Furthermore, as the magnetic shield 51, an amorphous alloy of rare earth-transition metal such as TbFeCo and GdFeCo may be used. Furthermore, a stacked structure such as Co/Pt, Co/Pd, and Co/Ni may be used as the magnetic shield 51.

The magnetic shield 51 (and the protection layer 52) mentioned above may be provided also in the magnetic memory elements according to the embodiment and magnetic memory elements modified based on them (magnetic memory elements having one of the first to fourth stacked configurations).

Characteristics of the magnetic memory element according to the embodiment will now be described.

The inventors conducted a simulation using micromagnetics in regard to the characteristics of the magnetic field generation unit (the second stacked unit SB2). In this simulation, the following model was employed. As the fourth ferromagnetic layer 40 (thickness: 10 nm), a perpendicular magnetization film of Ms (saturated magnetization)=1000 emu/cc and Ku=8 Merg/cm$^3$ was used. As the second nonmagnetic layer 20$n$, a Cu layer (thickness: 2 nm) was used. As the third ferromagnetic layer 30 (thickness: 2 nm), an in-plane magnetization film of Ms=800 emu/cc and Ku=5000 erg/cm$^3$ was used. The spin polarization degree was made 0.4 and the dumping constant was made 0.01.

The magnetization fixed layer (the fourth ferromagnetic layer 40) and the spacer layer (the second nonmagnetic layer 20$n$) were made in a pillar shape with a diameter (width perpendicular to the Z-axis) of 24 nm. Two models of the case where the diameter (the width D30) of the third ferromagnetic layer 30 was 24 nm and the case where it was 12 nm were assumed.

In this simulation, attention is focused on the characteristic that the current density changes depending on the size of the third ferromagnetic layer 30 to increase the oscillation frequency. Therefore, calculation was carried out in regard to a model in which the structure of the magnetization memory unit (magnetic memory unit) was not provided and the structure of the magnetic field generation unit was provided.

Figure 13:
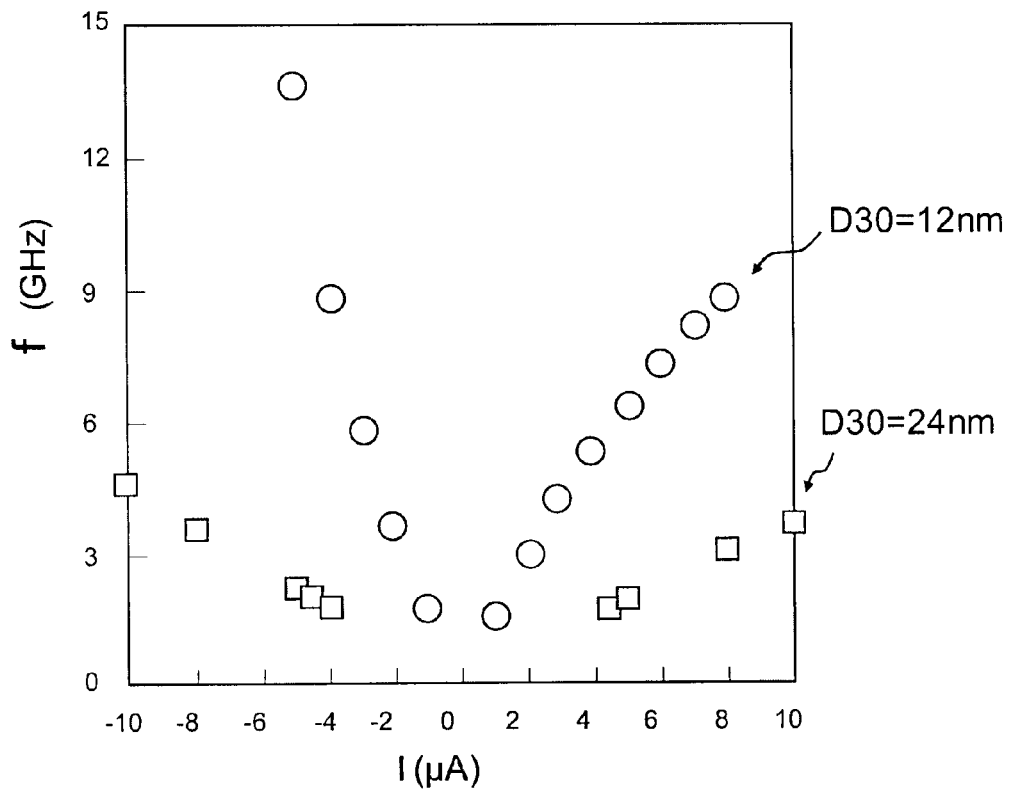
FIG. 13 is a graph showing the result of a simulation of the characteristics of the magnetic memory element.

FIG. 13 is a graph illustrating the result of a simulation of the characteristics of the magnetic memory element.

The drawing illustrates the results of a simulation using micromagnetics of the characteristics of the magnetic field generation unit. The horizontal axis is current I (microampere; μA). The vertical axis is the oscillation frequency $f_s$ (gigahertz; GHz) of the high frequency magnetic field generated from the third ferromagnetic layer 30.

As can be seen from FIG. 13, in the case where the size (the width D30) of the third ferromagnetic layer 30 is 12 nm, oscillation with a high frequency is obtained as compared to the case of 24 nm. It is considered that this is because a larger current density in the third ferromagnetic layer 30 leads to oscillation at a higher frequency.

Thus, since the current density increases by reducing the width D30 of the third ferromagnetic layer 30, a magnetic field with a higher frequency can be generated and caused to act on the magnetic memory layer of the magnetic memory unit.

In the case where the structure of the magnetic memory unit is provided, the stray magnetic field applied to the third ferromagnetic layer 30 changes, and accordingly the relationship between the oscillation frequency and the current shifts as compared to the characteristics in the case where the structure of the magnetic memory unit is not provided. However, the behavior of the change in the oscillation frequency to the current density can be sufficiently grasped by the result obtained by the model employed in this simulation (a configuration in which the structure of the magnetic memory unit is not provided). Also in the case where the structure of the magnetic memory unit is provided, similarly to the above, the current density increases by reducing the width D30 of the third ferromagnetic layer 30, and consequently a magnetic field with a higher frequency can be generated.

Magnetic memory elements 161 to 165 having the following configurations, respectively, will now be described as examples of the characteristics of the magnetic memory element provided with the structure of the magnetic memory unit. These magnetic memory elements correspond to first to fifth examples, respectively.

The magnetic memory element 161 (see FIG. 5C) has the first stacked configuration; specifically, it has a similar configuration to the magnetic memory element 112. The magnetic memory element 162 (see FIG. 6C) has the first stacked configuration; specifically, it has a similar configuration to the magnetic memory element 112$a$. The magnetic memory element 163 (see FIG. 9E) has the second stacked configuration; specifically, it has a similar configuration to the magnetic memory element 124. The magnetic memory element 164 (see FIG. 10C) has the third stacked configuration; specifically, it has a similar configuration to the magnetic memory element 132. The magnetic memory element 165 (see FIG. 11E) has the fourth stacked configuration; specifically, it has a similar configuration to the magnetic memory element 144.

In the magnetic memory element 161, the direction of the magnetic component in Z-axis of the magnetization of the first ferromagnetic layer 10 is the same as the direction of the magnetic component in Z-axis of the magnetization of the fourth ferromagnetic layer 40. In the magnetic memory elements 162 to 165, the direction of the magnetic component in Z-axis of the magnetization of the first ferromagnetic layer 10 is opposite to the direction of the magnetic component in Z-axis of the magnetization of the fourth ferromagnetic layer 40.

In the magnetic memory element 161, the first ferromagnetic layer 10, the first nonmagnetic layer 10$n$, and the second ferromagnetic layer 20 were made in a pillar shape with a diameter of 24 nm. As the first ferromagnetic layer 10 (thickness: 6 nm), a perpendicular magnetization film of Ms=400 emu/cc and Ku=10 Merg/cm$^3$ was used. As the first nonmagnetic layer 10$n$, a MgO layer (thickness: 1 nm) was used. As the second ferromagnetic layer 20 (thickness: 2 nm), a perpendicular magnetization film of Ms=600 emu/cc and Ku=2.7 Merg/cm$^3$ was used. As the fourth ferromagnetic layer 40 (thickness: 10 nm), a perpendicular magnetization film of Ms=1000 emu/cc and Ku=8 Merg/cm$^3$ was used. As the second nonmagnetic layer 20$n$, a Cu layer (thickness: 2 nm) was used. As the third ferromagnetic layer 30 (thickness: 2 nm), an in-plane magnetization film of Ms=800 emu/cc and Ku=5000 erg/cm$^3$ was used. The diameters of the third ferromagnetic layer 30, the second nonmagnetic layer 20$n$, and the fourth ferromagnetic layer 40 were set to 12 nm. As the third nonmagnetic layer 30$n$, a Cu film with a thickness of 2 nm was used. The spin polarization degree in the first stacked unit SB1 was made 0.6 and the spin polarization degree in the second stacked unit SB2 was made 0.4.

In the magnetic memory element 162, as the third nonmagnetic layer 30$n$, a Ru film with a thickness of 2 nm was used. A structure was employed in which the fourth ferromagnetic layer 40 and the first ferromagnetic layer 10 were antiferromagnetically coupled to each other. Otherwise, similar conditions to the magnetic memory element 161 were used.

In the magnetic memory element 163, the second stacked configuration was employed, and a Ru film with a thickness of 3 nm was used as the third nonmagnetic layer 30$n$. A structure was employed in which no spin torque was transferred between the third ferromagnetic layer 30 and the second ferromagnetic layer 20. Otherwise, similar conditions to the magnetic memory element 161 were used.

The magnetic memory element 164 was configured to be similar to the magnetic memory element 161 except that the third stacked configuration was employed. The magnetic memory element 165 was configured to be similar to the magnetic memory element 161 except that the fourth stacked configuration was employed.

Furthermore, also a magnetic memory element 191 (not shown) of a reference example was studied. In the magnetic memory element 191, a model was employed in which the second stacked unit SB2 and the third nonmagnetic layer 30n were not provided, and only the first stacked unit SB1 was provided. That is, the magnetic memory element 191 has a configuration of not using the resonance assist. The first stacked unit SB1 in the magnetic memory element 191 was configured to be similar to that in the magnetic memory element 161.

In these magnetic memory elements, a simulation was carried out in regard to the reversal of the magnetization in the second ferromagnetic layer 20.

Figure 14:
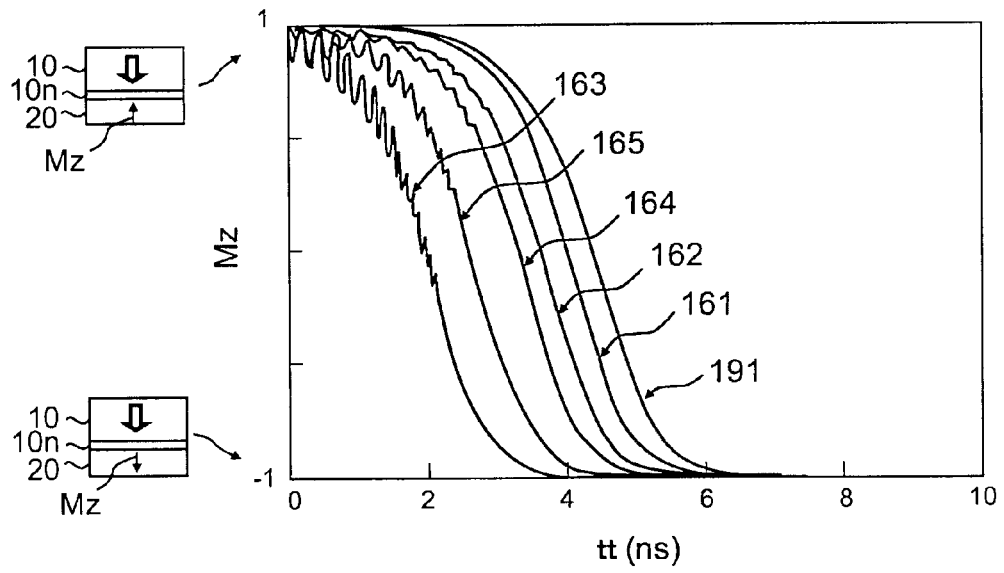
FIG. 14 is a graph showing the result of a simulation of the characteristics of the reversal of the magnetization in the magnetic memory elements.

FIG. 14 is a graph illustrating the result of a simulation of the characteristics of the reversal of the magnetization in the magnetic memory elements.

The horizontal axis is time tt (nanosecond; ns). The time tt is the time elapsed from when a current is passed through the stacked body SB0. The vertical axis represents the Z-axis of the magnetization in the second ferromagnetic layer 20. Herein, the manner in which the magnetization Mz transitions from the antiparallel state to the parallel state is calculated. The magnetization of the first ferromagnetic layer 10 (the magnetization fixed layer) is in the downward direction. Before passing a current, the magnetization Mz of the second ferromagnetic layer 20 (the memory layer) was set in the upward direction ("1"). By passing a current, the magnetization Mz of the second ferromagnetic layer 20 changes into the downward direction ("−1"). Here, the supplied current was set to 15 μA.

As shown in FIG. 14, in the magnetic memory element 191 (not using the magnetic field generation unit) of the reference example, the reversal time of the magnetization Mz was 4.4 ns. In contrast, in all of the magnetic memory elements 161 to 165 of the first to fifth examples, the magnetization reversal occurs more quickly.

Figure 15:
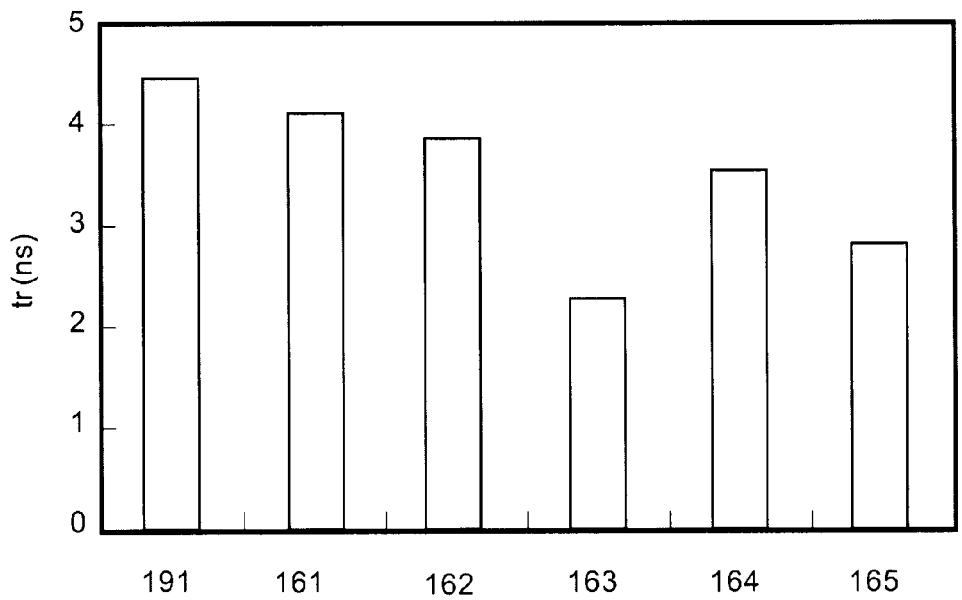
FIG. 15 is a graph showing the characteristics of the reversal of the magnetization in the magnetic memory elements.

FIG. 15 is a graph illustrating the characteristics of the reversal of the magnetization in the magnetic memory elements.

The drawing is derived based on the results of FIG. 14. That is, the time tt when the magnetization Mz becomes −0.5 is found as the reversal time tr, and the results thereof are shown to be compared. The vertical axis of FIG. 15 is the reversal time tr (ns).

As can be seen from FIG. 15, the reversal time tr is short in the magnetic memory elements 161 to 165 of the examples as compared to the magnetic memory element 191 of the reference example. The effect of making the reversal quicker is significant particularly in the magnetic memory element 163. This is due to the fact that, in the second stacked configuration, the distance between the oscillation layer (the third ferromagnetic layer 30) and the memory layer (the second ferromagnetic layer 20) is short and therefore a larger magnetic field acts.

Figure 16:
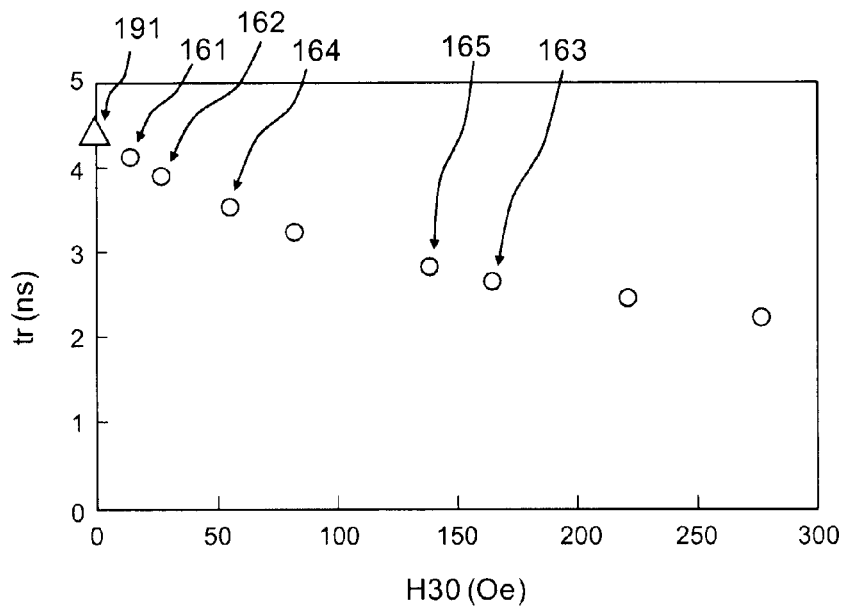
FIG. 16 is a graph showing the characteristics of the magnetic memory elements.

FIG. 16 is a graph illustrating characteristics of the magnetic memory elements.

FIG. 16 illustrates the result of a simulation of the magnetic field strength H30 that is generated from the oscillation layer (the third ferromagnetic layer 30) and applied to the memory layer (the second ferromagnetic layer 20). The horizontal axis is the magnetic field strength H30 (oersted; Oe), and the vertical axis is the reversal time tr. In the drawing, the magnetic memory element 191 of the reference example is indicated by a triangle mark, and the magnetic memory elements (including the magnetic memory elements 161 to 165) according to the embodiment are indicated by circle marks.

As can be seen from FIG. 16, the reversal time tr is shortened as the magnetic field strength H30 increases.

Of the first to fourth stacked configurations, the reversal time tr is short in the second stacked configuration in which the third ferromagnetic layer 30 and the second ferromagnetic layer 20 are close together.

When the magnetic memory element 161 and the magnetic memory element 162 are compared, the stray magnetic field in the second ferromagnetic layer 20 can be made smaller in the magnetic memory element 162 in which the first ferromagnetic layer 10 and the fourth ferromagnetic layer 40 can be antimagnetically coupled to each other. Therefore, the configuration of the magnetic memory element 162 is one of the preferable configurations.

The inventor has found through simulation the oscillation frequency $f_s$ of the third ferromagnetic layer 30 when the ratio of the width D30 (e.g. diameter) of the oscillation layer (the third ferromagnetic layer 30) to the width (e.g. diameter) of the memory layer (the second ferromagnetic layer 20) is changed.

Figure 17:
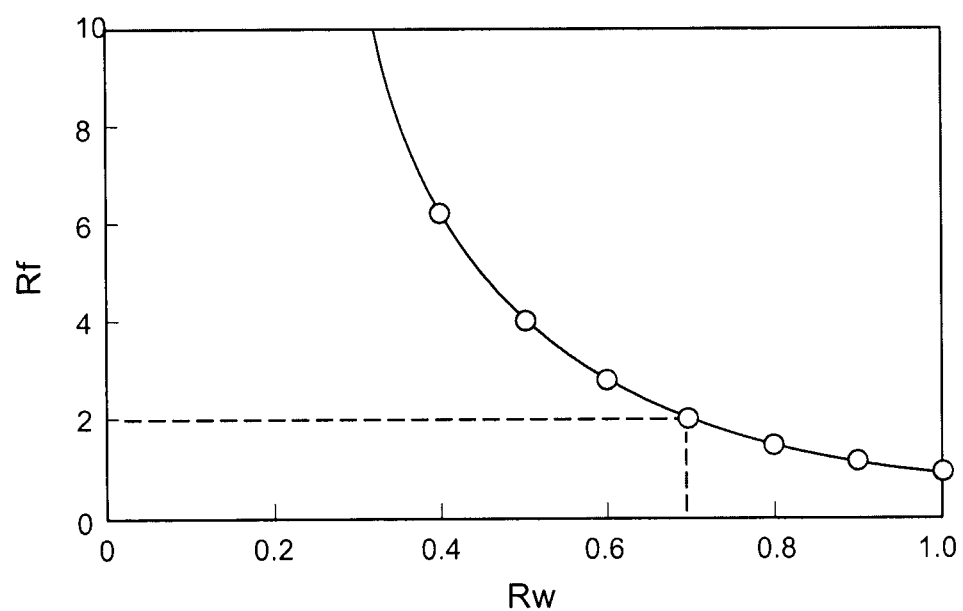
FIG. 17 is a graph showing the oscillation characteristics in the magnetic memory element.

FIG. 17 is a graph illustrating the oscillation characteristics in the magnetic memory element.

The horizontal axis represents the ratio Rw of the width D30 of the third ferromagnetic layer 30 to the width of the second ferromagnetic layer 20.

The vertical axis represents the ratio Rf of the oscillation frequency $f_s$ of the third ferromagnetic layer 30 to the oscillation frequency $f_s$ of the third ferromagnetic layer 30 when the ratio Rw is 1.

As shown in FIG. 17, when the ratio Rw of width is small, the ratio Rf of oscillation frequency is large and a high oscillation frequency is obtained. For example, to obtain an oscillation frequency of twice or more that when the ratio Rw is 1 (when the third ferromagnetic layer 30 has the same size as the first stacked unit SB1), the ratio Rw may be set not more than 0.7. That is, the width D30 of the third ferromagnetic layer 30 may be set not more than 0.7 times the width (e.g. the first diameter D1) of the first stacked unit SB1. Thereby, an oscillation frequency $f_s$ of twice or more the oscillation frequency $f_s$ when the third ferromagnetic layer 30 has the same size as the first stacked unit SB1 is obtained.

Figure 18A:
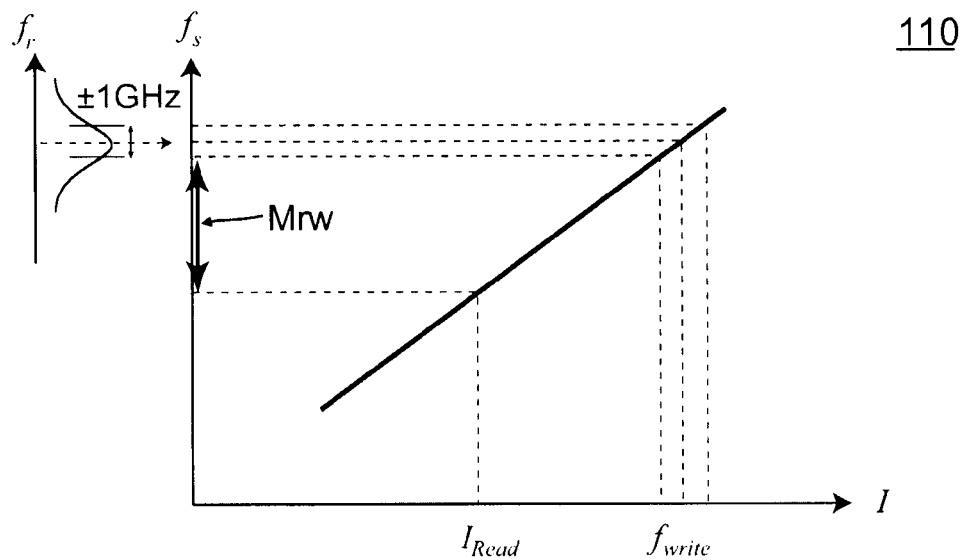
FIG. 18A and FIG. 18B are graphs showing the characteristics of the magnetic memory elements.
Figure 18B:
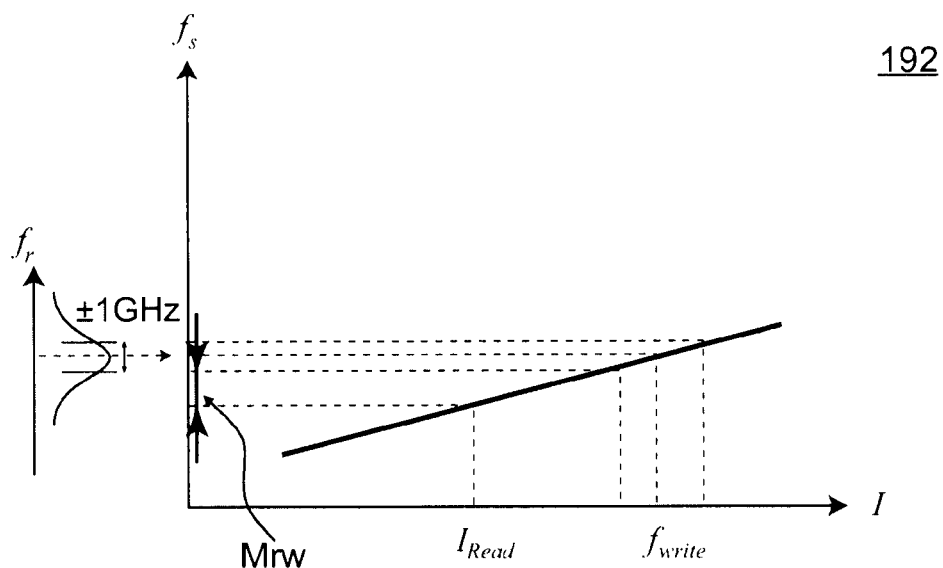

FIG. 18A and FIG. 18B are graphs illustrating the characteristics of the magnetic memory elements.

FIG. 18A illustrates characteristics of the magnetic memory element (e.g. the magnetic memory element 110 etc.) according to the embodiment. FIG. 18B illustrates characteristics of a magnetic memory element 192 (not shown) of a reference example. In the magnetic memory element 192, the width D30 of the third ferromagnetic layer 30 (specifically, the width of the second stacked unit SB2) is the same as the width of the first stacked unit SB1.

The horizontal axis of the drawings (graphs) represents the current I supplied to the stacked body SB0. The vertical axis represents the oscillation frequency $f_s$ of the magnetic field generated in the third ferromagnetic layer 30 (the second stacked unit SB2). The characteristics of the resonance frequency $f_r$ in the second ferromagnetic layer 20 are schematically drawn along the vertical axis.

As shown in FIG. 18B, in the magnetic memory element 192 of the reference example, the oscillation frequency $f_s$ obtained by the current in the write operation (write current $I_{write}$) is low. Here, although the value of the read current is set to a value small enough for the magnetic field generation unit not to make oscillation, the frequency band in the case where the magnetic field generation unit has accidentally made oscillation due to the read current is near to the band of the resonance frequency of the magnetic memory unit. That is, the difference between the oscillation frequency $f_s$ corresponding to the current in the read operation (read current $I_{read}$) and the oscillation frequency $f_s$ obtained by the write current $I_{write}$ (the margin Mrw between the write operation and the read operation) is small. Also in such a case, to avoid the occurrence of false writing at the time of reading, the frequency band in the case where oscillation has undesirably occurred due to the read current is preferably kept away from the resonance frequency of the memory unit by approximately ±1 GHz.

In contrast, as shown in FIG. 18A, in the magnetic memory element (e.g. the magnetic memory element 110) according to the embodiment, the oscillation frequency $f_s$ obtained by the write current $I_{write}$ is high. Therefore, the margin Mrw between the write operation and the read operation is large, and the occurrence of false writing can be sufficiently suppressed.

That is, the embodiment can expand the margin between the write current $I_{write}$ and the read current $I_{read}$.

Thus, in the magnetic memory elements according to the embodiment described above, the cross-sectional area S30 of the third ferromagnetic layer 30 when cut along a plane perpendicular to the stacking direction SD1 is smaller than the cross-sectional area S1 of the first stacked unit SB1 when cut along a plane perpendicular to the stacking direction SD1. That is, in the embodiment, the size (e.g. the width D30) of the third ferromagnetic layer 30 is decreased. At this time, there may be a case where anisotropy is exhibited due to magnetic strain and the current margin for obtaining stable oscillation is narrowed. In this case, by making the third ferromagnetic layer 30 amorphous, the narrowing of the current margin can be suppressed. In the embodiment, the state where the third ferromagnetic layer 30 is amorphous includes a state where polycrystalline particles are contained in the third ferromagnetic layer 30. Also in this state, the narrowing of the current margin can be suppressed.

The dimensions (width, thickness, etc.) of the layers included in the magnetic memory element according to the embodiment are found through an electron microscope photographic image or the like, for example.

A method for manufacturing a magnetic memory element according to the embodiment will now be described.

In the following description, "material A\material B" means that material B is stacked on material A.

A lower electrode (not shown) is formed on a wafer, and then the wafer is placed in an ultrahigh vacuum sputter apparatus. On the lower electrode, Ta (a contact layer for contact with an electrode, also functioning as a stopper layer and an underlayer), a CoFeB layer (the second ferromagnetic layer 20), MgO (the first nonmagnetic layer 10n), a CoFeB\FePt layer (the first ferromagnetic layer 10), and a layer of Ta (a contact layer for contact with an electrode) thereon are stacked in this order. Here, the strength of the magnetic anisotropy in the film surface perpendicular direction of the CoFeB layer and the CoFeB\FePt layer can be adjusted by annealing in a magnetic field. Thereby, a workpiece is formed.

Next, EB (electron beam) lithography is performed to form a resist mask with a diameter of 100 nm. Ion milling is performed to remove the portions not covered with the resist of the workpiece until the lower electrode becomes exposed.

Next, a $SiO_2$ film that forms an embedded insulating layer is deposited, then planarization is performed by CMP (chemical mechanical polishing) or the like, and then RIE (reactive ion etching) or the like is performed to etch the entire surface to expose the Ta of a contact layer for contact with an electrode.

Subsequently, a Ta\Ru layer (a contact layer for contact with an electrode, also functioning as a stopper layer), an FePt\CoFeB\Cu\Py layer (the magnetic field generation unit), and Ta (a contact layer for contact with an electrode) are stacked in this order.

Next, an EB (electron beam) resist is applied to perform EB exposure to form a resist mask with a diameter of 20 nm. Ion milling is performed to remove the portions not covered with the resist of the workpiece until the Ta layer of a stopper layer becomes exposed.

Next, a $SiO_2$ film that forms an embedded insulating layer is deposited, then planarization is performed by CMP (chemical mechanical polishing) or the like, and then RIE (reactive ion etching) or the like is performed to etch the entire surface to expose the contact layer for contact with an electrode.

Further, a resist is applied to the entire surface, and a stepper exposure apparatus is used to perform patterning on the resist so that the opening of the resist may correspond to the position of an upper electrode. A Cu film is formed so as to fill the opening corresponding to the upper electrode, and the upper electrode is formed by the lift-off method. Further, an interconnection (not shown) electrically connected to the upper electrode is provided.

A method for manufacturing the magnetic memory element 124k will now be described.

Similarly to the manufacturing method described above, on the lower electrode, a Ta\Ru layer (a contact layer for contact with an electrode, also functioning as a stopper layer), the magnetic memory unit, and Ta (a stopper layer) are stacked in this order, and the workpiece is processed to a size of 100 nm in diameter. Then, the third nonmagnetic layer 30n, the fourth ferromagnetic layer 40, the second nonmagnetic layer 20n, the third ferromagnetic layer 30, and a contact layer for contact with an electrode are stacked in this order, and the workpiece is processed to a size of 20 nm in diameter. Then, a SiN layer that forms the protection layer 52 is formed, and then a Py layer that forms the magnetic shield 51 is formed. Etchback is performed to leave the Py layer on the side wall of the stacked body SB0. Further, a $SiO_2$ film that forms an embedded insulating layer is formed and processed, and an upper electrode is formed. Thereby, the magnetic memory element 124k is fabricated. Furthermore, the magnetic memory element 124l is fabricated by changing the shape of the embedded insulating layer.

In the magnetic memory element according to the embodiment, the mutual relationship (shape and position) between the first stacked unit SB1 and the third ferromagnetic layer 30 (e.g. the second stacked unit SB2) can be set by self-alignment. An example of the self-alignment manufacturing method will now be described.

FIG. 19A to FIG. 19D are schematic cross-sectional views in order of the processes, illustrating a method for manufacturing the magnetic memory element according to the first embodiment.

Figure 19A:
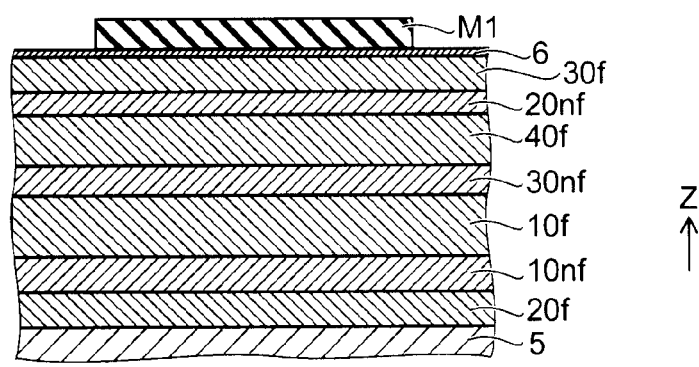
FIG. 19A to FIG. 19D are schematic cross-sectional views in order of the processes, showing a method for manufacturing the magnetic memory element according to the first embodiment.

As shown in FIG. 19A, an underlayer etc. are formed on a base 5 (e.g. an electrode layer etc.), and then a second ferromagnetic layer film 20f that forms the second ferromagnetic layer 20, a first nonmagnetic layer film 10nf that forms the first nonmagnetic layer 10n, a first ferromagnetic layer film 10f that forms the first ferromagnetic layer 10, a third nonmagnetic layer film 30nf that forms the third nonmagnetic layer 30n, a fourth ferromagnetic layer film 40f that forms the fourth ferromagnetic layer 40, a second nonmagnetic layer film 20nf that forms the second nonmagnetic layer 20n, and a third ferromagnetic layer film 30f that forms the third ferromagnetic layer 30 are formed in this order. Further, an upper film 6 (e.g. an electrode layer etc.) is formed thereon to form a workpiece. A mask member M1 having a prescribed configuration is formed on the workpiece. Photolithography and etching, for example, are used for the processing of the mask member M1. The configuration of the mask member M1 when projected onto a plane perpendicular to the Z-axis corresponds to the configuration of the first stacked unit SB1.

Figure 19B:
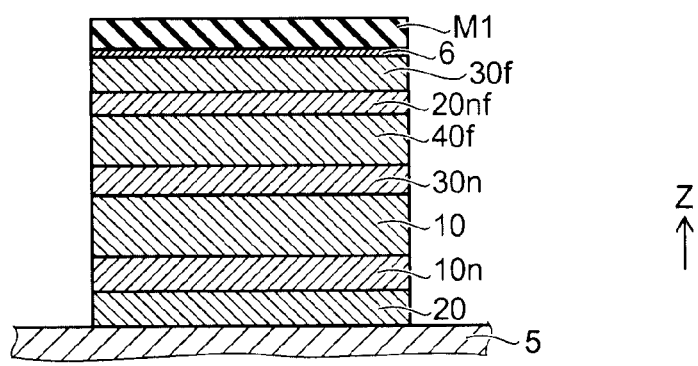

As shown in FIG. 19B, the workpiece is processed by performing a first etching using the mask member M1 as a mask until the base 5 becomes exposed. Thereby, the configuration of the third nonmagnetic layer 30n, the first ferromagnetic layer 10, the first nonmagnetic layer 10n, and the second ferromagnetic layer 20 is obtained.

Figure 19C:
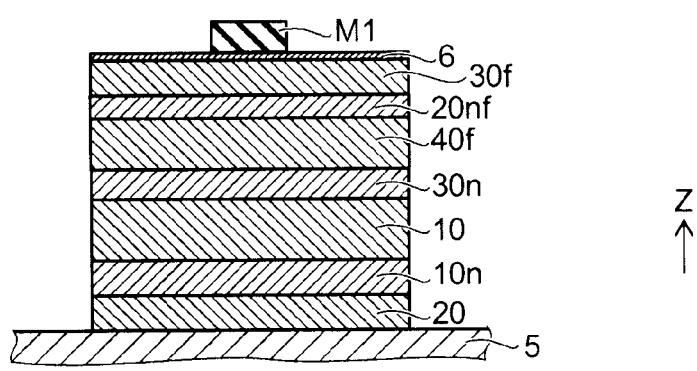

As shown in FIG. 19C, the mask member M1 is slimmed. Thereby, the width (the length along an axis perpendicular to the Z-axis) of the mask member M1 is decreased. The configuration of the mask member M1 after slimming when projected onto a plane perpendicular to the Z-axis corresponds to the configuration of the third ferromagnetic layer 30 (in this example, the configuration of the second stacked unit SB2).

Figure 19D:
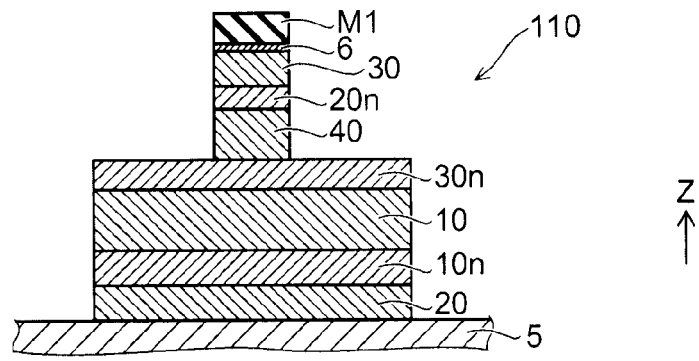

As shown in FIG. 19D, the workpiece is processed by performing a second etching using the mask member M1 after slimming as a mask until the third nonmagnetic layer 30n becomes exposed. Thereby, the configuration of the fourth ferromagnetic layer 40, the second nonmagnetic layer 20n, and the third ferromagnetic layer 30 is obtained. The conditions of the second etching are different from the conditions of the first etching.

Thus, for example, the magnetic memory element 110 (or the magnetic memory element 110a etc.) is obtained.

FIG. 20A to FIG. 20D are schematic cross-sectional views in order of the processes, illustrating another method for manufacturing the magnetic memory element according to the first embodiment.

Figure 20A:
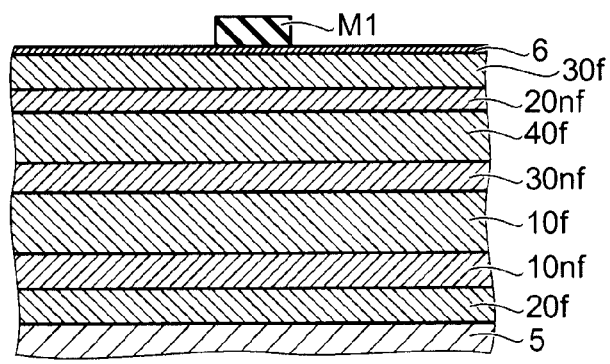
FIG. 20A to FIG. 20D are schematic cross-sectional views in order of the processes, showing another method for manufacturing the magnetic memory element according to the first embodiment.

As shown in FIG. 20A, an underlayer etc. are formed on the base 5, and then the second ferromagnetic layer film 20f, the first nonmagnetic layer film 10nf, the first ferromagnetic layer film 10f, the third nonmagnetic layer film 30nf, the fourth ferromagnetic layer film 40f, the second nonmagnetic layer film 20nf, and the third ferromagnetic layer film 30f are formed in this order. Further, the upper film 6 is formed to form a workpiece. The mask member M1 having a prescribed configuration is formed on the workpiece. The configuration of the mask member M1 when projected onto a plane perpendicular to the Z-axis corresponds to the configuration of, for example, the third ferromagnetic layer 30 (in this example, the configuration of the second stacked unit SB2).

Figure 20B:
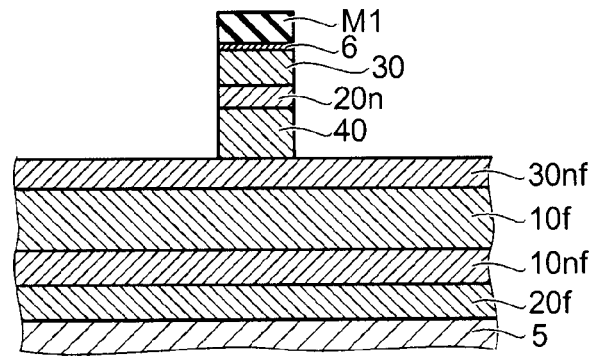

As shown in FIG. 20B, the workpiece is processed by performing the first etching using the mask member M1 as a mask until the third nonmagnetic layer 30n becomes exposed. Thereby, the configuration of the second stacked unit SB2 (the fourth ferromagnetic layer 40, the second nonmagnetic layer 20n, and the third ferromagnetic layer 30) is obtained.

Figure 20C:
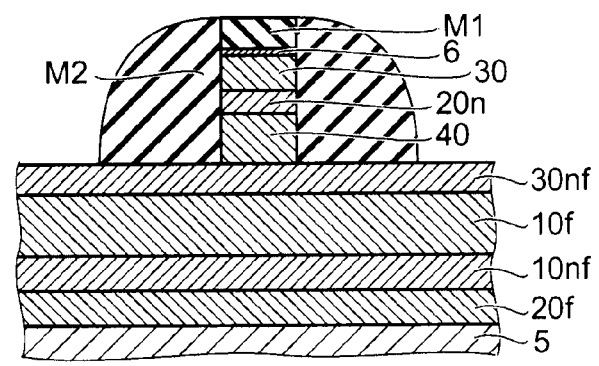

As shown in FIG. 20C, a sacrifice layer for processing is formed so as to cover the workpiece and then the entire surface is etched to form a side wall member M2 on the side walls of the mask member M1 and the second stacked unit SB2. The configuration of the mask unit formed of the mask member M1 and the side wall member M2 when projected onto a plane perpendicular to the Z-axis corresponds to the configuration of the first stacked unit SB1.

Figure 20D:
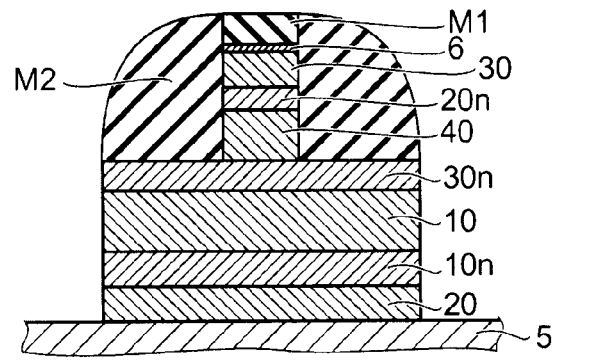

As shown in FIG. 20D, the workpiece is processed by performing the second etching using the mask unit formed of the mask member M1 and the side wall member M2 as a mask until the base 5 becomes exposed. Thereby, the configuration of the third nonmagnetic layer 30n, the first ferromagnetic layer 10, the first nonmagnetic layer 10n, and the second ferromagnetic layer 20 is obtained. The conditions of the second etching are different from the conditions of the first etching.

Thus, for example, the magnetic memory element 110 (or the magnetic memory element 110a etc.) is obtained.

By using at least one of the method using slimming and the method using the side wall member M2 in the above manner, an arbitrary magnetic memory element according to the embodiment (an arbitrary magnetic memory element having any of the first to fourth stacked configurations) can be fabricated.

Second Embodiment

A second embodiment relates to a nonvolatile memory device. The nonvolatile memory device includes the magnetic memory element according to the first embodiment.

Figure 21:
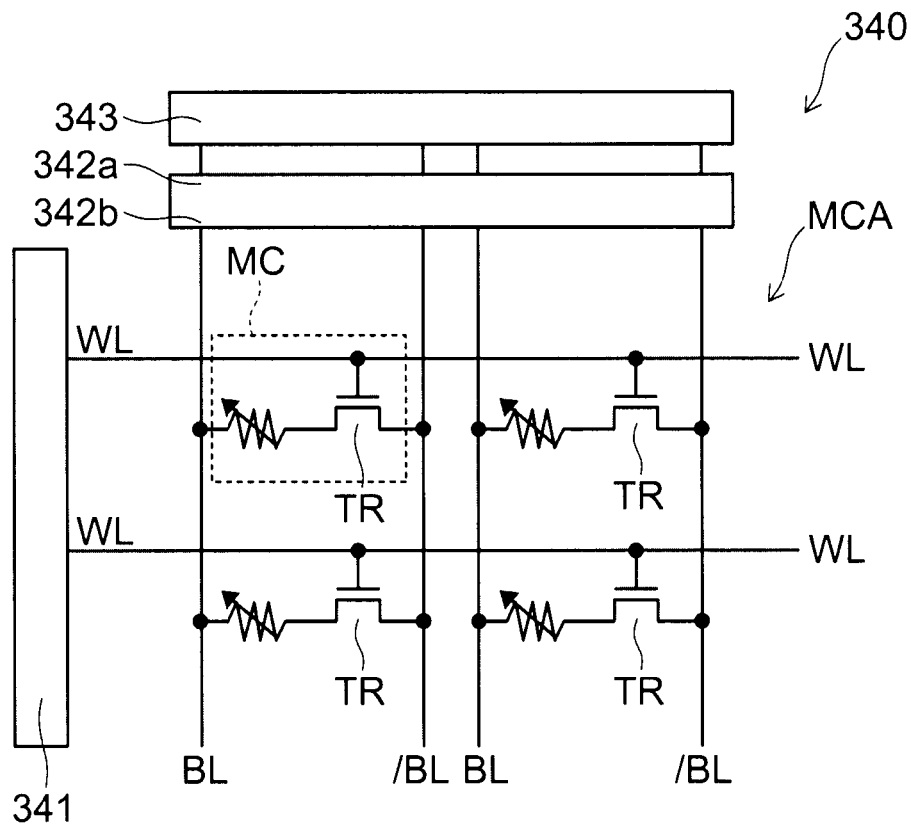
FIG. 21 is a schematic diagram showing a nonvolatile memory device according to a second embodiment.

FIG. 21 is a schematic diagram illustrating the configuration of a nonvolatile memory device according to the second embodiment.

As shown in FIG. 21, a nonvolatile memory device 340 according to the embodiment includes a memory cell array MCA. The memory cell array MCA includes a plurality of memory cells MC arranged in a matrix configuration.

Each memory cell MC includes one of the magnetic memory elements according to the embodiment as an MTJ element.

In the memory cell array MCA, a plurality of bit line pairs (a bit line BL and a bit line /BL) are arranged so as to each extend in the column direction. In the memory cell array MCA, a plurality of word lines WL are arranged so as to each extend in the row direction.

The memory cell MC is placed at the facing portion of the bit line BL and the word line WL. Each memory cell MC includes the MTJ element and a selection transistor TR. One end of the MTJ element is connected to the bit line BL. The other end of the MTJ element is connected to the drain terminal of the selection transistor TR. The gate terminal of the selection transistor TR is connected to the word line WL. The source terminal of the selection transistor TR is connected to the bit line /BL.

A row decoder 341 is connected to the word line WL. A write circuit 342a and a read circuit 342b are connected to the bit line pair (the bit line BL and the bit line /BL). A column decoder 343 is connected to the write circuit 342a and the read circuit 342b.

Each memory cell MC is selected by the row decoder 341 and the column decoder 343. An example of the data writing to the memory cell MC is as follows. First, to select a memory cell MC to perform data writing on, the word line WL connected to the memory cell MC is activated. Thereby, the selection transistor TR is switched to ON.

Here, a bidirectional write current is supplied to the MTJ element. Specifically, in the case where a write current is supplied to the MTJ element from left to right, the write circuit 342a applies a positive potential to the bit line BL and applies the ground potential to the bit line /BL. In the case where a write current is supplied to the MTJ element from right to left, the write circuit 342a applies a positive potential to the bit line /BL and applies the ground potential to the bit line BL. Thus, data "0" or data "1" can be written to the memory cell MC.

An example of the data reading from the memory cell MC is as follows. First, a memory cell MC is selected. The read circuit 342b supplies, for example, a read current flowing from right to left to the MTJ element. Then, the read circuit 342b detects the resistance value of the MTJ element based on this read current. Thus, the information stored in the MTJ element can be read out.

Figure 22:
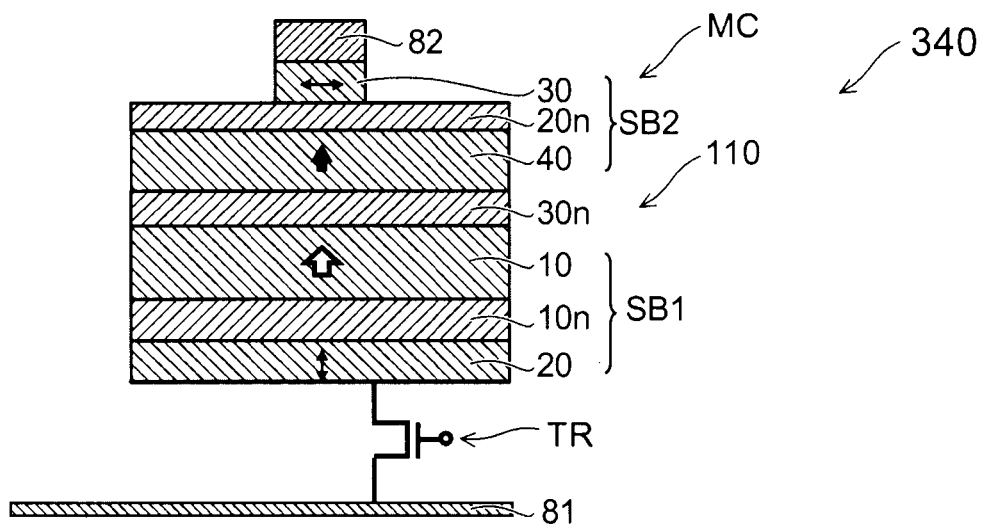
FIG. 22 is a schematic view showing the nonvolatile memory device according to the second embodiment.

FIG. 22 is a schematic view illustrating the configuration of the nonvolatile memory device according to the second embodiment.

FIG. 22 illustrates the configuration of one memory cell MC. Although the magnetic memory element 110 is used in this example, any magnetic memory element according to the embodiment may be used.

As shown in FIG. 22, the nonvolatile memory device 340 according to the embodiment includes the magnetic memory element (e.g. the magnetic memory element 110) according to the embodiment, a first interconnection 81, and a second interconnection 82. The first interconnection 81 is directly or indirectly connected to one end of the magnetic memory element 110 (e.g. the end of the first stacked unit SB1). The second interconnection 82 is directly or indirectly connected to the other end of the magnetic memory element 110 (e.g. the end of the second stacked unit SB2).

Herein, "directly connected" includes a state of being electrically connected with no other conductive member (e.g. a via electrode, an interconnection, etc.) interposed therebetween. "Indirectly connected" includes a state of being electrically connected with another conductive member (e.g. a via electrode, an interconnection, etc.) interposed therebetween and a state of being connected in a state where a switch (e.g. a transistor, etc.) is interposed therebetween to enable switching between conduction and non-conduction.

One of the first interconnection 81 and the second interconnection 82 corresponds to, for example, the word line WL. The other of the first interconnection 81 and the second interconnection 82 corresponds to, for example, the bit line BL or the bit line /BL.

As shown in FIG. 22, the nonvolatile memory device 340 may further include the selection transistor TR. The selection transistor TR is provided at least one of between the magnetic memory element 110 and the first interconnection 81 (a first position) and between the magnetic memory element 110 and the second interconnection 82 (a second position). Thereby, the operations described in regard to FIG. 21 can be performed.

The embodiment provides a magnetic memory element and a nonvolatile memory device that can achieve high density.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of magnetic memory elements such as ferromagnetic layers, nonmagnetic layers, and electrodes and components of nonvolatile memory devices such as interconnections and transistors from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory elements and nonvolatile memory devices practicable by an appropriate design modification by one skilled in the art based on the magnetic memory elements and the nonvolatile memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory element comprising: a stacked body,
    the stacked body including:
        a first stacked unit including:
            a first ferromagnetic layer, a magnetization of the first ferromagnetic layer being fixed in a first direction having a component perpendicular to a film surface of the first ferromagnetic layer;
            a second ferromagnetic layer being stacked with the first ferromagnetic layer along a stacking direction, a direction of a magnetization of the second ferromagnetic layer being variable in directions perpendicular to a film surface of the second ferromagnetic layer; and
            a first nonmagnetic layer provided between the first ferromagnetic layer and the second ferromagnetic layer; and
        a second stacked unit stacked with the first stacked unit along the stacking direction, the second stacked unit including:
            a third ferromagnetic layer, a direction of a magnetization of the third ferromagnetic layer being variable in directions parallel to a film surface of the third ferromagnetic layer;
            a fourth ferromagnetic layer stacked with the third ferromagnetic layer along the stacking direction, a magnetization of the fourth ferromagnetic layer being fixed in a second direction having a component perpendicular to a film surface of the fourth ferromagnetic layer; and
            a second nonmagnetic layer provided between the third ferromagnetic layer and the fourth ferromagnetic layer,
        a cross-sectional area of the third ferromagnetic layer being smaller than a cross-sectional area of the first stacked unit when cut along a plane perpendicular to the stacking direction,
        a direction of the magnetization of the second ferromagnetic layer being set to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer, the current being flowed through the first stacked unit and the second stacked unit.

2. The element according to claim 1, wherein outer edges of the second ferromagnetic layer and the first nonmagnetic layer in the plane include a portion outside an outer edge of the second stacked unit in the plane.

3. The element according to claim 1, wherein the first direction is opposite to the second direction.

4. The element according to claim 1, wherein
the stacked body further includes a third nonmagnetic layer provided between the first stacked unit and the second stacked unit and
the third nonmagnetic layer contains at least one nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), titanium (Ti), and osmium (Os) or an alloy including two or more selected from the group.

5. The element according to claim 1, wherein
the stacked body further includes a third nonmagnetic layer provided between the first stacked unit and the second stacked unit and
the third nonmagnetic layer contains a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group.

6. The element according to claim 1, wherein
the stacked body further includes a third nonmagnetic layer provided between the first stacked unit and the second stacked unit,
the third nonmagnetic layer contains a metal selected from the group consisting of ruthenium (Ru), osmium (Os), and iridium (Ir) or an alloy including at least two selected from the group, and
a thickness of the third nonmagnetic layer is not more than 3 nanometers.

7. The element according to claim 1, wherein the outer edge of the first stacked unit is on an outside of the outer edge of the second stacked unit.

8. The element according to claim 1, wherein a maximum width of the third ferromagnetic layer along a direction perpendicular to the stacking direction is not more than 0.7 times a maximum width of the first stacked unit along the direction perpendicular to the stacking direction.

9. The element according to claim 1, wherein the third ferromagnetic layer is amorphous.

10. The element according to claim 1, further comprising a magnetic shield opposed to at least a part of a side surface of the stacked body.

11. A nonvolatile memory device comprising:
a magnetic memory element including a stacked body, the stacked body including:
a first stacked unit including:
a first ferromagnetic layer, a magnetization of the first ferromagnetic layer being fixed in a first direction having a component perpendicular to a film surface of the first ferromagnetic layer;
a second ferromagnetic layer being stacked with the first ferromagnetic layer along a stacking direction, a direction of a magnetization of the second ferromagnetic layer being variable in directions perpendicular to a film surface of the second ferromagnetic layer; and
a first nonmagnetic layer provided between the first ferromagnetic layer and the second ferromagnetic layer; and
a second stacked unit stacked with the first stacked unit along the stacking direction, the second stacked unit including:
a third ferromagnetic layer, a direction of a magnetization of the third ferromagnetic layer being variable in directions parallel to a film surface of the third ferromagnetic layer;
a fourth ferromagnetic layer stacked with the third ferromagnetic layer along the stacking direction, a magnetization of the fourth ferromagnetic layer being fixed in a second direction having a component perpendicular to a film surface of the fourth ferromagnetic layer; and
a second nonmagnetic layer provided between the third ferromagnetic layer and the fourth ferromagnetic layer,
a cross-sectional area of the third ferromagnetic layer being smaller than a cross-sectional area of the first stacked unit when cut along a plane perpendicular to the stacking direction,
a direction of the magnetization of the second ferromagnetic layer being set to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer;
a first interconnection directly or indirectly connected to one of the first ferromagnetic layer and the second ferromagnetic layer; and
a second interconnection directly or indirectly connected to one of the third ferromagnetic layer and the fourth ferromagnetic layer,
the first and second interconnections being configured to flow the current though the first stacked unit and the second stacked unit along the stacking direction.

12. The device according to claim 11, further comprising a selection transistor provided at least one of between the magnetic memory element and the first interconnection and between the magnetic memory element and the second interconnection.

13. The device according to claim 11, wherein outer edges of the second ferromagnetic layer and the first nonmagnetic layer in the plane include a portion outside an outer edge of the second stacked unit in the plane.

14. The device according to claim 11, wherein the first direction is opposite to the second direction.

15. The device according to claim 11, wherein
the stacked body further includes a third nonmagnetic layer provided between the first stacked unit and the second stacked unit and
the third nonmagnetic layer contains at least one nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), titanium (Ti), and osmium (Os) or an alloy including two or more selected from the group.

16. The device according to claim 11, wherein
the stacked body further includes a third nonmagnetic layer provided between the first stacked unit and the second stacked unit and
the third nonmagnetic layer contains a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group.

17. The device according to claim 11, wherein
the stacked body further includes a third nonmagnetic layer provided between the first stacked unit and the second stacked unit,
the third nonmagnetic layer contains a metal selected from the group consisting of ruthenium (Ru), osmium (Os), and iridium (Ir) or an alloy including at least two selected from the group, and
a thickness of the third nonmagnetic layer is not more than 3 nanometers.

18. The device according to claim 11, wherein the outer edge of the first stacked unit is on an outside of the outer edge of the second stacked unit.

19. The device according to claim 11, wherein a width of the third ferromagnetic layer along a direction perpendicular to the stacking direction is not more than 0.7 times a width of the first stacked unit along the direction perpendicular to the stacking direction.

20. The device according to claim 11, wherein the third ferromagnetic layer is amorphous.

* * * * *